(12) United States Patent
Prodanov et al.

(10) Patent No.: US 11,056,613 B2
(45) Date of Patent: Jul. 6, 2021

(54) METHOD FOR PRODUCTION OF QUANTUM RODS WITH PRECISELY CONTROLLABLE WAVELENGTH OF EMISSION

(71) Applicant: The Hong Kong University of Science and Technology, Hong Kong (CN)

(72) Inventors: Maksym F. Prodanov, Kharkov (UA); Valerii Vladimirovich Vashchenko, Kharkov (UA); Abhishek Kumar Srivastava, Lucknow (IN); Hoi Sing Kwok, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 26 days.

(21) Appl. No.: 16/380,598

(22) Filed: Apr. 10, 2019

(65) Prior Publication Data

US 2019/0312175 A1  Oct. 10, 2019

Related U.S. Application Data

(60) Provisional application No. 62/761,853, filed on Apr. 10, 2018.

(51) Int. Cl.
*H01L 33/06* (2010.01)
*H01L 33/00* (2010.01)
*H01L 33/28* (2010.01)

(52) U.S. Cl.
CPC .......... *H01L 33/06* (2013.01); *H01L 33/0083* (2013.01); *H01L 33/285* (2013.01)

(58) Field of Classification Search
CPC ..... C09K 11/883; C09K 11/025; C09K 11/56; H01L 33/0083; H01L 33/06; H01L 33/285

See application file for complete search history.

(56) References Cited

U.S. PATENT DOCUMENTS

| 5,505,928 | A  | 4/1996  | Alivisatos et al. |
| 5,537,000 | A  | 7/1996  | Alivisatos et al. |
| 5,751,018 | A  | 5/1998  | Alivisatos et al. |
| 5,990,479 | A  | 11/1999 | Weiss et al.      |
| 6,207,229 | B1 | 3/2001  | Bawendi et al.    |
| 7,303,628 | B2 | 12/2007 | Alivisatos et al. |

(Continued)

FOREIGN PATENT DOCUMENTS

WO    WO 2016/189531 A1    12/2016

OTHER PUBLICATIONS

Carbone, L., et al., "Synthesis and Micrometer-Scale Assembly of Colloidal CdSe/CdS Nanorods Prepared by a Seeded Growth Approach", *Nano Letters*, V. 7(10), pp. 2942-2950, (2007).

(Continued)

*Primary Examiner* — Dung A. Le
(74) *Attorney, Agent, or Firm* — Leydig, Voit & Mayer, Ltd.

(57) ABSTRACT

A method for fabricating quantum rods includes: preparing a Cd-precursor; preparing a S-precursor and CdSe seeds; preparing a Zn-precursor; mixing the S-precursor and the CdSe seeds with the Cd-precursor in a reaction mixture; adding the Zn-precursor to the reaction mixture; stopping the reaction; and performing a purification process to obtain the quantum rods.

20 Claims, 14 Drawing Sheets

(56) References Cited

U.S. PATENT DOCUMENTS

| | | | | |
|---|---|---|---|---|
| 8,404,154 | B2* | 3/2013 | Breen | B82Y 30/00 |
| | | | | 252/301.6 S |
| 10,253,256 | B2* | 4/2019 | Owen | C07F 7/003 |
| 2002/0042070 | A1* | 4/2002 | Saraf | C12Q 2523/319 |
| | | | | 435/6.11 |
| 2003/0115455 | A1 | 6/2003 | Aull et al. | |
| 2010/0314646 | A1* | 12/2010 | Breen | G02B 6/004 |
| | | | | 257/98 |
| 2012/0205598 | A1* | 8/2012 | Li | C09K 11/565 |
| | | | | 252/519.34 |
| 2018/0327664 | A1* | 11/2018 | Houtepen | C09K 11/883 |

OTHER PUBLICATIONS

Deka, S., et al., "CdSe/CdS/ZnS Double Shell Nanorods with High Photoluminescense Efficiency and Their Exploitation as Biolabeling Probes", *J. Am. Chem. Soc.*, V. 131(8), pp. 2948-2958, (2009).

Hadar, I. et al.; "Semiconductor Seeded Nanorods with Graded Composition Exhibiting High Quantum-Yield, High Polarization, and Minimal Blinking", *Nano Letters*, pp. 2524-2531 (2017).

Hill, L.J., et al., "Directing the Deposition of Ferromagnetic Cobalt onto Pt-Tipped CdSe@CdS Nanorods: Synthetic and Mechanistic Insights", *ACS Nano*, V. 6(10), pp. 8632-8645, (2012).

Huang, J., et al., "Alkyl Chains of Surface Ligands Affect Polytypism of CdSe-Nanocrystals and Play and Important Role in the Synthesis of Anisotropic Nanoheterostructures", *J. Amer. Chem. Soc.*, V. 132(45), pp. 15866-15868. (2010).

Mokari, T., et al., "Synthesis and Properties of CdSe/ZnS Core/Shell Nanorods", *Chem. Mater.*, V. 15(20), pp. 3955-3960, (2003).

Sitt, A., et al., "Highly Emissive Nano Rod-in-Rod Heterostructures with Strong Linear Polarization", *Nano Letters*, V. 11(5), pp. 2054-2060, (2011).

Talapin, D.V., et al., "Seeded Growth of Highly Luminescent CdSe/CdS Nano-heterostructures with Rod and Tetrapod Morphologies", *Nano Lett.*, V. 7(10), pp. 2951-2959, (2007).

Wang, W., et al., "Ligand Control of Growth, Morphology, and Capping Structure of Colloidal CdSe Nanoraods", *Chem. Mater.*, V. 19(10), pp. 2573-2580, (2007).

Chen, J, et al, "Quantum-dot displays: Giving LCDs a Competitive Edge Through Color," *SID Information Display*, pp. 2-7, (2013).

Yan, J. "Polymer stabilized optically-isotropic liquid crystals for next-generation and photonics applications", *J. Mater. Chem.* 21, pp. 7870-7877, (2011).

Luo, Z. et al., "Wide color gamut LCD with a quantum dot backlight", *Optics Express*, vol. 21(22), pp. 26269-26284, (2013).

Shirasaki, Y., "Emergence of colloidal quantum-dot light-emitting technologies", *Nature Photonics*, vol. 7, pp. 13-23, (Jan. 2013).

Yip, W.C., et al., "Efficient polarization converter for projection displays", *Applied Optics*, vol. 36(25), pp. 6453-6457, (1997).

Srivastava, A.K., et al., "Photo-aligned ferroelectric liquid crystals for modern photonics", *SPIE Newsroom Article*, DOI: 10.1117/2.1201412.005595, (2017).

Ploshnik, E., et al., "Hierarchical Surface Patterns of Nanorods Obtained by Co-Assembly with Block Copolymers in Ultrathin Films", *Adv. Mater.*, 22, pp. 2774-2779, (2010).

Srivastava, A.K., et al., "Fast switchable grating based on orthogonal photo alignments of ferroelectric liquid crystals", *Appl. Phys. Lett.*, vol. 101, pp. 031112-0311124-4, (2012).

Lu, R., "LED-Lit LCD TVs", *Molecular Crystals and Liquid Crystals*, 488, pp. 246-259, (2008).

Qu, L., et al., "Control of Photoluminescence Properties of CdSe Nanocrystals in Growth", *J. Am. Chem. Soc.*, vol. 124(9), pp. 2049-2055, (2002).

Srivastave, A.K., et al., "Photoaligned Nanorod Enhancement Films with Polarized Emission of Liquid-Crystal Display Applications", *Advance Materials*, vol. 29(33), Article 1701091, 6 pages, (Sep. 2017).

Ahmed, W., et al. "Quantitative Analysis of Gold Nanorod Alignment after Electric Field-Assisted Deposition", *Nano Letters*, 9(11), pp. 3786-3794, (2019).

Hasegawa, M, et al., "Polarized fluorescent emission from aligned electrospun nanofiber sheets containing semiconductor nanorods", *Appl. Phys. Lett.*, vol. 106, 051103, 6 pages, (2015).

Talapin, D., et al. "CdSe/CdS/ZnS and CdSe/ZnSe/ZnS Core-Shell-Shell Nanocrystals", *J. Phys. Chem. B*, 108(49), pp. 18826-18831, (2004).

Xie, R., et al., "Synthesis and Characterization of Highly Luminescent CdSe-Core CdS/$Zn_{0.5}Cd_{0.5}$S/ZnS Multishell Nanocrystals", *J. Am. Chem. Soc.* 127(20), pp. 7480-7488, (2005).

Cho, J., et al., "Highly efficient Blue-Emitting CdSe-derived Core/Shell Gradient Alloy Quantum Dots with Improved Photoluminescent Quantum Yield and Enhanced Photostability", *Langmuir*, 33(15), pp. 3711-3719, (Mar. 31, 2017).

Rizzo, a., et al., "Polarized Light Emitting Diode by Long-Range Nanorod Self-Assembling on a Water Surface", *ACS Nano*, vol. 3(6), pp. 1506-1512, (2009).

Persano, A., et al., "Photoconduction Properties in Aligned Assemblies of Colloidal CdSe/CdS Nanorods", *ACS NANO*, vol. 4(3), pp. 1646-1652, (2010).

Mohammadimasoudi, M., et al., "Fast and versatile deposition of aligned semiconductor nanorods by dip-coating on a substrate with interdigitated electrodes", *Optical Materials Express*, vol. 3(12), 10 pages, (Dec. 2013).

Thomas, N. Le, et al., "Exciton Fine Structure in Single CdSe Nanorods", *Physical Review Letters*, PRL 94, pp. 016803-016803-4, (2005).

* cited by examiner

METHOD FOR PRODUCTION OF QUANTUM RODS WITH PRECISELY CONTROLLABLE WAVELENGTH OF EMISSION

CROSS-REFERENCE TO RELATED APPLICATIONS

This patent application claims the benefit of U.S. Provisional Patent Application No. 62/761,853, filed Apr. 10, 2018, which is incorporated by reference herein in its entirety.

BACKGROUND

The demand for semiconductor nanoparticles (SNPs) with luminescence in visible spectral range is increasing due to their many applications, for example, in photonics, displays, microelectronics, photovoltaics and bioluminescent imaging. Due to their small size, electronic properties, and the possibilities for chemical modification, SNPs can act as controlled "artificial" atoms with properties designed to meet the specific requirements of various technological applications. Using appropriate surface modification of colloidal nanoparticles, SNPs can be tightly packed or embedded into different kinds of inorganic and organic matrices. In addition, SNPs can be assembled in tightly packed ordered or disordered arrays.

Interest in semiconductor nanocrystals with a narrow band gap has also increased significantly in recent years, primarily due to their growing application in information displays, solar cells, optoelectronics (e.g., lasers, optical modulators, photodetectors and photoconverting devices), large format cheap microelectronics, bioimaging systems, biosensors, etc. Products based on the quantum dots (QDs) technology (e.g., displays, lasers, light-emitting diodes (LEDs), matrixes for portable cameras, etc.) have already been introduced to the global market.

Despite the relatively high cost of scaled-up production of SNPs relative to mass-produced organic dyes and inorganic bulk semiconductors, luminescent SNPs are often preferred materials for photonic and lighting applications because they provide a precisely controllable emission and absorption spectra which inorganic bulk or epitaxially-grown semiconductors and organic molecules are unable to achieve. Additionally, an advantage of luminescent SNPs over organic molecules is the long-term stability of their spectral properties and tuning of emission range without significant changes in material composition, whereas the generation of different colors using organic dyes requires completely different compounds and synthesis which have different color stability that results in color mangling with time.

Quantum rods (QRs) are luminescent SNPs of elongated shape, which relative to QDs provide additional advantages in their properties such as emission of linearly polarized light and large extinction coefficient along with high luminescence quantum yield. Particularly, parallel aligned QRs in films can be used as enhancement films (EF) for display backlight applications in liquid crystalline displays (LCDs) and replace quantum dot enhancement films (QDEFs) which are common in the current state of the art. Due to polarized emission, QRs can not only increase the color gamut of LCDs but also improve considerably their overall optical efficiency. These advantageous quantum rods are also in high demand for application in LEDs either as on-chip light convertors or utilizing electroluminescent effects. However, a serious constraint on the widespread application of QRs in the current state of the art is difficulties in precise control and reproducibility of emission wavelength in their syntheses, especially in case of QRs which emit in the green spectral range (515-560 nm). In the current state of the art, there is no reliable method for synthesis of quantum rods with emission below 540 nm of visible spectral range. However, for good color gamut, "green" color should be through emission with $\lambda_{em}$ 520-525, and also there is a need in bright "blue" QRs with emission in the range 450-470 nm for display and LED applications.

In the current state of the art, "green" QRs may be fabricated based on a seeded approach where seeds (typically CdSe QDs) are synthesized in a separate step prior to growth of a shell. In a next step, the CdSe seeds are covered with a CdS shell. The emission wavelength of thus obtained QRs increases along with increasing seed size, showing a great dependence on the size of initial seeds. Thus, the seed size required for preparation of the "green" rods must not exceed 2.3 nm. Here, the main challenge is to limit the seed size to be small enough so that the synthesized QRs, in the subsequent step, possess $\lambda_{em}$<560 nm. Since the reaction time for such small seeds is very small (typically a few seconds at 320-380° C. after injection of an Se-precursor), it is difficult to terminate the reaction quickly enough to prevent their further growth. Special techniques such as quick cooling of the reaction mixture in an acetone/2-propanole bath or injection of a cold low boiling solvent have been explored, but these approaches have not been effective enough and it remained very difficult to control the size of the seeds precisely and reliably when the diameter is below 3 nm. Therefore, reproducibility of $\lambda_{em}$ for "green" QRs is very low. Additionally, this problem is further aggravated at the next step (i.e., CdS shell formation), which also includes a fast evolution of the spectra at the beginning of the growth of the CdS shell around the CdSe seeds. Typically, a very large red shift 50 nm) occurs during the first minute of the synthesis, and then the emission shifts gradually further to the red range over 7-10 minutes. Because it is also very difficult to stop the reaction precisely when the emission wavelength reaches the desired value at this step, reproducibility is very limited for this additional reason.

Additional efforts have been made to try to control $\lambda_{em}$ of seeded core-shell QRs, but these methods have not been successful. For example, methods based on limiting reaction rate are not efficient for QR synthesis, as low temperature synthesis of the seeds or subsequent QRs results in poor crystallinity of obtained nanoparticles which in turn dramatically deteriorates their luminescent properties. Additionally, methods based on dilution of reaction solutions or use of element precursors which are less reactive than Cd alkylphosphonate cannot result in the formation of nanoparticles with rod-like shape, since both concentration and reactivity were shown to be key prerequisites for shape control during anisotropic SNP growth.

Recently, it was reported that the addition of [Zn] to the reaction mixture during the growth of QRs results in a small hypochromic shift of emission wavelength of the fabricated gradient alloy nanoparticles after it reached some maximal value. However, in spite of the very high amount of [Zn] introduced in the synthesis (Zn/Cd molar ratio no less than 4), the reported blue shift during the synthesis was no more than 10 nm in the best case. Furthermore, there are no reported key details about the QR synthesis, such as quantities of the seeds, sulfur, trioctylphosphine (TOP), trioctylphosphine oxide (TOPO), the ratio between a hexylphosphonic acid (HPA) and hexadecylphosphonic acid (HDPA), and details of reaction procedure. Therefore, this proposed method for quantum rods synthesis cannot be considered as reproducible.

Yet another proposed method for the introduction of Zn to the composition of seeded quantum rods is a synthesis of core/double shell CdSe/CdS/ZnS semiconductor rods. Although in this case a significant increase in quantum efficiency was observed after treatment with $Zn(C_2H_5)_2$, the method does not result in any "blue" shift and improvement of emission control. Moreover, the method requires special precautions because of the very high toxicity and pyrophoric properties of diethyl zinc and dimethyl cadmium used as metal precursors.

SUMMARY

In an exemplary embodiment, the present invention provides a method for fabricating quantum rods. The method includes: preparing a Cd-precursor; preparing a S-precursor and CdSe seeds; preparing a Zn-precursor; mixing the S-precursor and the CdSe seeds with the Cd-precursor in a reaction mixture; adding the Zn-precursor to the reaction mixture; stopping the reaction; and performing a purification process to obtain the quantum rods.

In another exemplary embodiment, the present invention provides a method for fabricating blue-shifted quantum rods. The method includes: preparing quantum rods comprising a CdSe seed and a CdS shell; blue-shifting the emission wavelength of the prepared quantum rods by reacting the prepared quantum rods with a Zn-precursor and an S-precursor; stopping the reaction; and performing a purification process to obtain the blue-shifted quantum rods.

In yet another exemplary embodiment, the present invention provides a quantum rod. The quantum rod includes: a seed; and a shell. The composition of the seed and the shell comprises Cd, Zn, S and/or Se.

DETAILED DESCRIPTION

Figure 1:
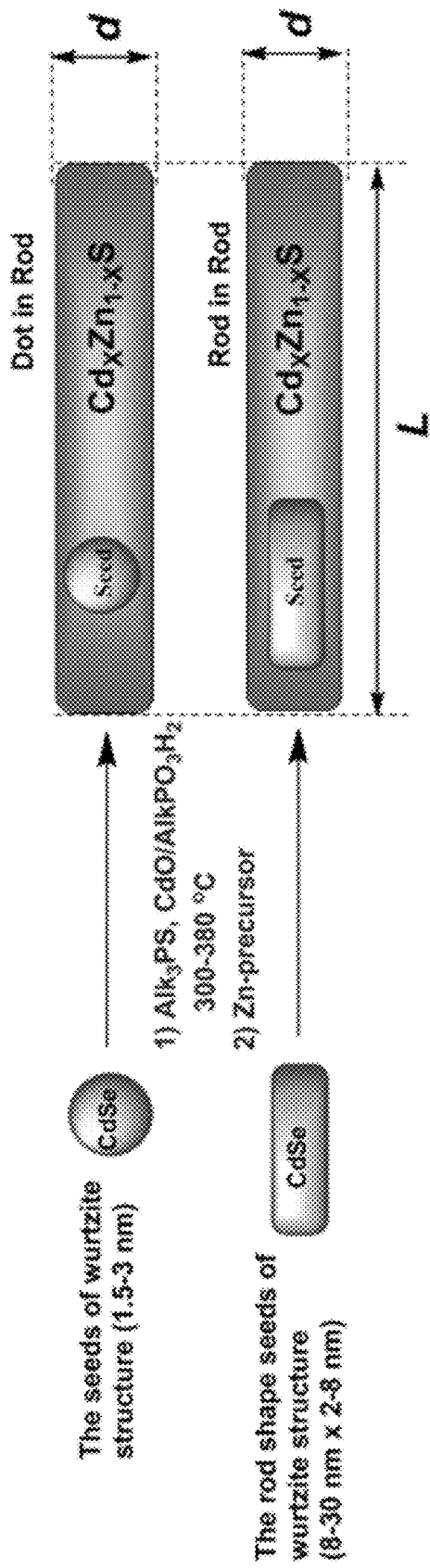
FIG. 1 depicts an exemplary general scheme for the fabrication of quantum rods with a high degree of control for the emission wavelength of the quantum rods.

Exemplary embodiments of the present invention provide a method to fabricate quantum rods, which is more reliable in terms of emission wavelength control than the current state of the art. Exemplary embodiments of the present invention further provide an efficient, detailed, convenient and reproducible method for production of quantum rods with precise control of emission wavelength in a broad range.

In an exemplary embodiment, the present invention provides a method for production of core-shell semiconductor nanoparticles of an elongated shape (also called "quantum rods"), which are characterized by very large (e.g., up to 100 nm or more) blue shift of emission wavelength during synthesis, and wherein the synthesis is slow and gradual enough to stop the reaction precisely at a desired value of $\lambda_{em}$ within this shift. The method is convenient and reproducible, and the method provides very uniform quantum rods with low size distribution, high quantum yield and enhanced stability with respect to the environment (taking advantage of treatment with [Zn]). The method makes possible to synthesize "truly" green (<530 nm) and blue (<470 nm) emitting quantum rods which are highly desirable for display and LED applications.

Exemplary embodiments of the present invention will be discussed herein in further detail, including, for example, amounts of reagents/solvents, composition, an addition method for a Zn-precursor, and quantum rod isolation/purification procedures. It will be appreciated that these exemplary embodiments are merely exemplary and non-limiting, and that one of ordinary skill in the art may derive other embodiments based thereon without departing from the inventive principles.

In an exemplary embodiment, the present invention provides a method for production of quantum rods with precisely controllable emission wavelength. The method includes: preparation of a Cd-precursor for shell growth; preparation of stock solution(s) of S-precursor and of CdSe seeds either as one solution or as separate solutions; preparation of a Zn-precursor of general formula $Zn(RCOO)_2$; initiating a reaction by fast injection (e.g., continuous injection which is completed in less than a few seconds) of the combined mixture of S-precursor and the seeds or separately of the seeds solution followed by the S-precursor solution to a reaction mixture with the prepared Cd-precursor in an appropriate solvent (i.e., a solvent which dissolves the reactants) at a high temperature for initiation of the shell growth (e.g., >300° C. to initiate growth of CdS material); single or multiple addition(s) of the Zn-precursor of general formula $Zn(RCOO)_2$ (e.g., in solid form) or a solution of the same to the reaction mixture; further single or multiple addition(s) of S-precursor when large blue shift (>35 nm) and/or increased reaction rate is/are desired; stopping the reaction at a time when desired emission properties are reached; and performing a purification procedure.

In a further exemplary embodiment, within the general formula for the Zn-precursor, R is alkyl group $C_nH_{2n-1}$ with n being in the range of 0 to 30.

In a further exemplary embodiment, within the general formula for the Zn-precursor, R is a carbon chain of total length in the range of 5 to 22 carbon atoms comprising two or more double or triple bonds. For example, R may be alkenyl group A-CH=CH—B— wherein independently A is a hydrogen (H) atom or an alkyl group $C_nH_{2n-1}$- with n in the range of 0 to 16 and B is either absent or is an alkylene group —$(CH_2)_n$— wherein n is in the range of 0 to 16.

In a further exemplary embodiment, within the general formula for the Zn-precursor, R is a branched alkyl or alkenyl group or a branched carbon chain of total length in the range of 5 to 22 carbon atoms comprising two or more double or triple bonds.

In a further exemplary embodiment, the Zn-precursor is an individual chemical compound.

In a further exemplary embodiment, the Zn-precursor is a mixture of organic compounds.

In a further exemplary embodiment, the Cd-precursor is prepared from Cd-containing derivatives and alkylphosphonic acids. For example, the Cd-precursor may be prepared from CdO and alkylphosphonic acids in a molar ratio wherein Cd to total phosphonic acids quantity is 1:2 in a solvent having a high boiling point (e.g., >300° C.). In another example, the Cd-precursor may be prepared from CdO and alkylphosphonic acids of general formula $C_nH_{2n+1}PO_3H_2$ wherein n is in the range of 6 to 18.

In a further exemplary embodiment, the S-precursor is prepared separately by dissolving the elementary sulfur in appropriate solvents. In an example, the appropriate solvents may be heavy alkanes ($C_{14}$-$C_{22}$), 1-octadecene, trialkylphosphines, trialkylphosphinoxides, and glicerole trialkanoates individually or in different combinations thereof.

In a further exemplary embodiment, the Zn-precursor is a solution of zinc salt or a mixture thereof with high boiling solvents. In an example, the high boiling solvents are heavy alkanes ($C_{14}$-$C_{22}$), 1-octadecene, trialkylphosphines, trialkylphosphinoxides, glicerole trialkanoates individually or in different combinations thereof.

In a further exemplary embodiment, the Zn-precursor is a solution of zinc oleate in 1-octadecene.

In a further exemplary embodiment, the Zn-precursor is added to the reaction mixture after initiating of CdS shell growth.

In a further exemplary embodiment, the Zn-precursor is added to the reaction mixture in a range from 1 s to 1000 min after initiating of CdS shell growth.

In a further exemplary embodiment, wherein after addition of the Zn-precursor, the reaction is allowed to proceed for a duration in a range from 1 min to 10,000 mins prior to terminating the reaction.

In a further exemplary embodiment, a Zn/Cd feed ratio is in the range 0.1 to 10.

In a further exemplary embodiment, the shift of emission wavelength of the resulting quantum rods to shorter wavelengths during the synthesis is in the range 10-150 nm.

FIG. 1 depicts an exemplary general scheme for the fabrication of quantum rods having $Cd_xZn_{1-x}S$ shells (wherein x is in the range of 0 to 0.99) with a high degree of control for the emission wavelength of the quantum rods. In particular, FIG. 1 depicts exemplary processes for obtaining two types of core-shell quantum rods: dots in rods (top part) and rods in rods (bottom part). One of ordinary skill in the art will appreciate that the seeds for both types (dot and rods) can be obtained according to known methods, and that these seeds are covered with organic ligands (such as alkyl phosphoric acids, trioctylphosphine oxide, alkylamines, long-chain carboxylic acids, etc.) and can form stable colloids in non-polar organic solvents (e.g., toluene, chloroform, hexane, octadecene).

With reference to FIG. 1:

AlkPO$_3$H$_2$ is a single compound or a mixture of different alkylphosphoric acids.

Alk is the alkyl group $CH_3$—$(CH_2)_n$— with n in the range of 2 to 20 (or from 3 to 18, or from 6 to 16).

x is the atom index of [Cd] atoms in the stoichiometric formulas for the shell material and is in the range of 0 to 0.99 (or from 0.95 to 0.05, or from 0.75 to 0.25).

Alk$_3$PS and Alk$_3$PSe are trialkylphosphine sulfide and trialkylphosphine selenide, respectively.

L is an average length of the quantum rods and in the range of 10 to 100 nm (or from 15 to 80 nm, or from 20 to 50 nm).

d is an average diameter of the quantum rods and in the range of 3 to 15 nm (or from 4 to 10 nm, or from 5 to 8 nm).

The shape of the quantum rods is depicted schematically. It will be appreciated that different shapes are possible, such as an ellipsoid shape, a cylinder shape, etc. The shape satisfies the condition L>d.

The Zn-precursor is a source of [Zn] atoms and may be a derivative of zinc carboxylates of general formulae $Zn(RCOO)_2$, wherein R is:

alkyl group $CH_3$—$(CH_2)_n$— with n in the range of 0 to 30 (or from 0 to 18);

alkenyl group A-CH=CH—B— wherein independently A is a hydrogen (H) atom or an alkyl group $CH_3$—$(CH_2)_n$— with n in the range of 0 to 16 and B is absent or is an alkylene group —$(CH_2)_n$— wherein n is in the range of 0 to 16;

a carbon chain of a total length in the range of 5 to 22 carbon atoms comprising two or more double or triple bonds; or a branched alkyl or alkenyl group or a branched carbon chain of a total length in the range of 5 to 22 carbon atoms comprising two or more double or triple bonds.

The Zn-precursor is an individual chemical compound or a mixture with other organic compounds (which may be low melting organic compounds, or which may be aliphatic, aromatic or long-chain alkenes and/or long chain alkylcarbxylic and/or alkenylcarboxylic acids).

It will be appreciated that in the case where x=0, the CdZnS shell may be referred to as a ZnS shell.

Figure 2:
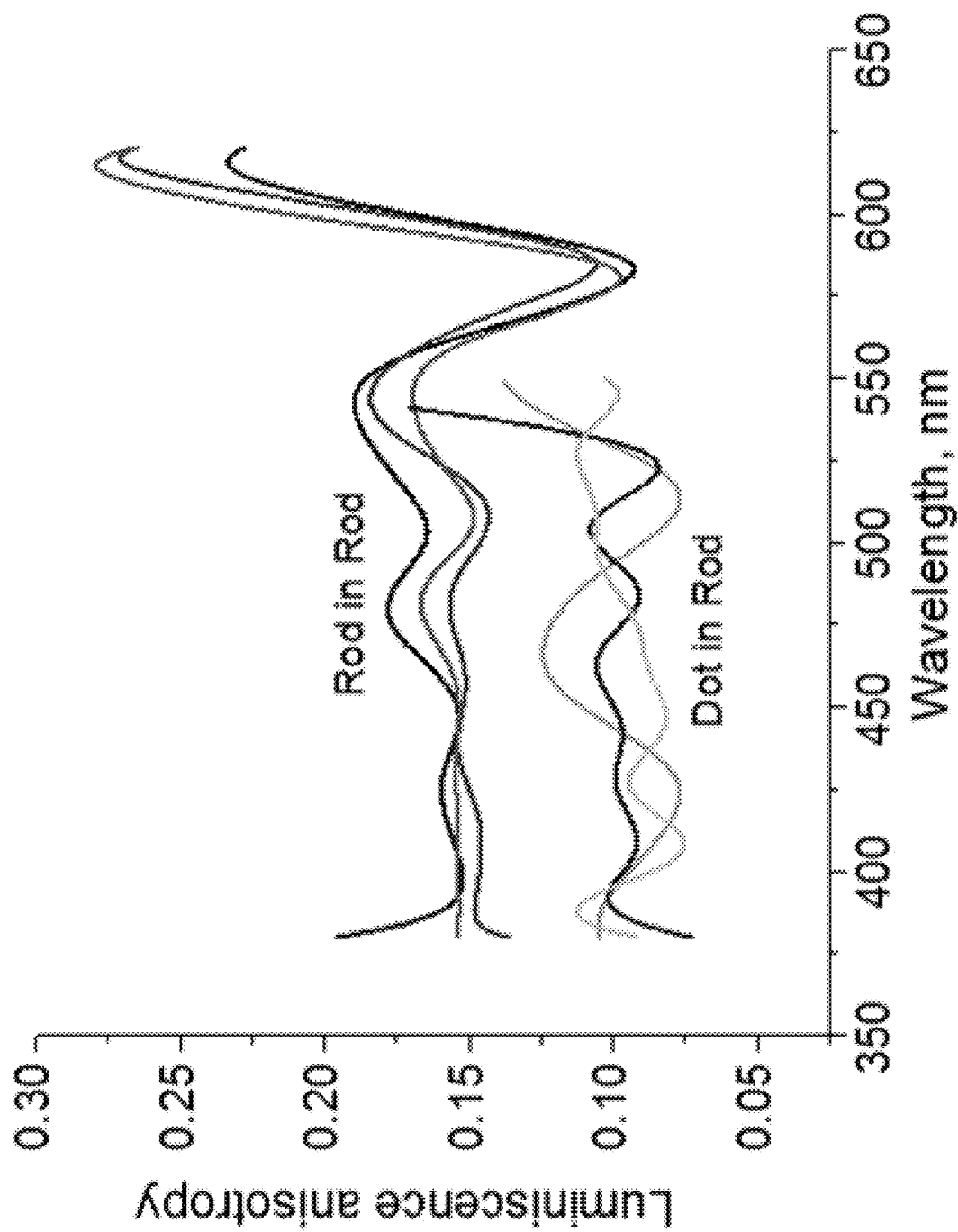
FIG. 2 depicts quantum rods emission anisotropy of quantum rods having a rod-in-rod structure (top three curves) and quantum rods having a dot-in-rod structure (bottom three curves).

As depicted in FIG. 2, rods-in-rods nanoparticles show a higher degree of emission anisotropy relative to dots-in-rods nanoparticles.

Figure 3:
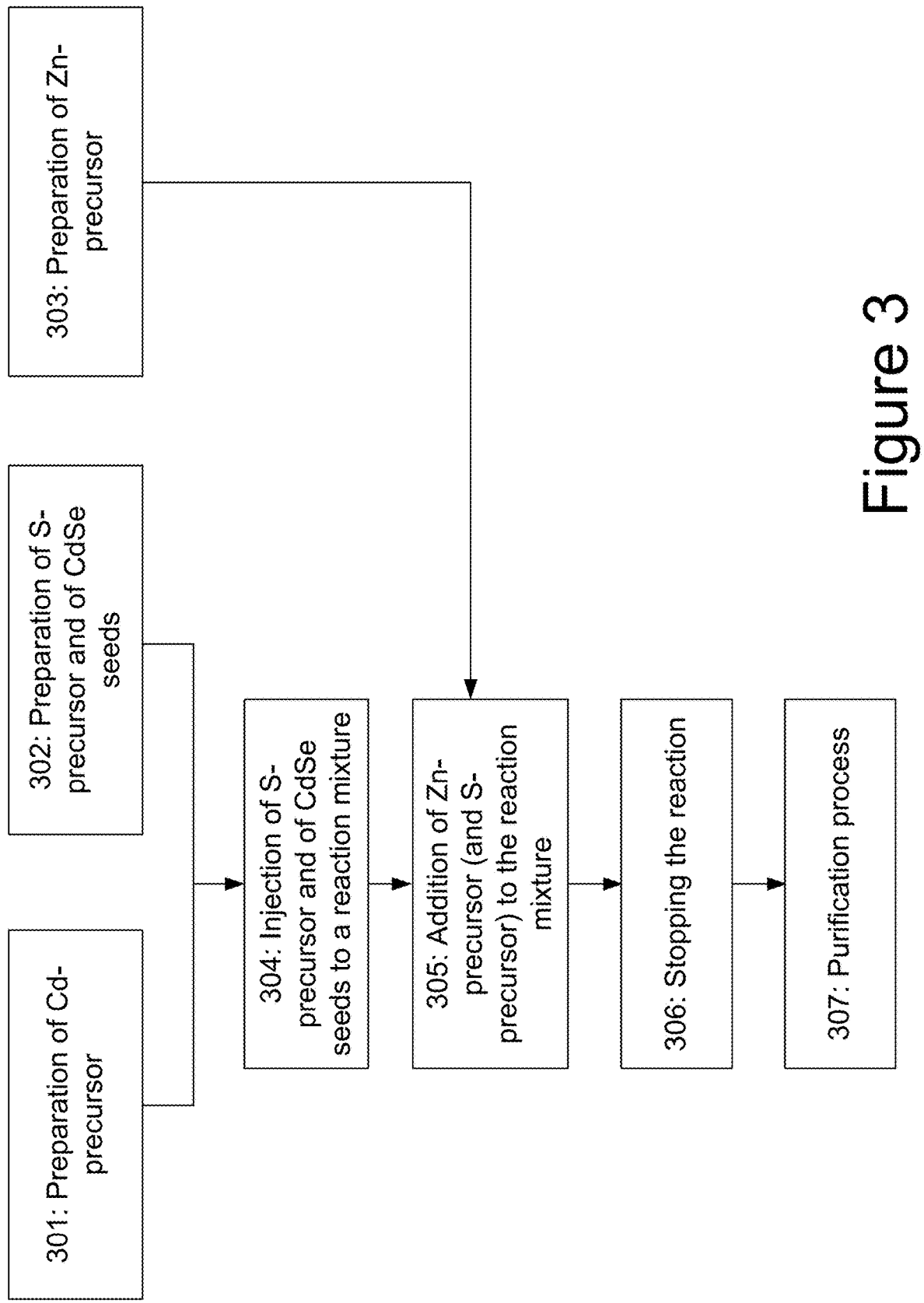
FIG. 3 depicts an exemplary process for fabrication of Zn-doped quantum rods in accordance with an exemplary embodiment of the present invention.

FIG. 3 depicts an exemplary process for fabrication of Zn-doped quantum rods in accordance with an exemplary embodiment of the present invention.

At stage 301, a Cd-precursor for the shell growth is prepared. The Cd-precursor may be prepared, for example, from CdO and alkylphosphonic acids of appropriate length in a molar ratio Cd to total phosphoric acids quantity no less than 1:2 in a solvent having a high boiling point. For example, a coordinating high boiling solvent may be used, such as trioctylphosphine oxide.

At stage 302, a stock solution of S-precursor and of CdSe seeds is prepared as one stock solution, or stock solutions of S-precursor and of CdSe seeds are prepared as separate solutions. A stock solution of S-precursor may be prepared by dissolving elementary sulfur in an appropriate high boiling solvent such as long-chain alkanes ($C_{14}$-$C_{22}$), 1-octadecene, or trioctylphosphine. In an exemplary implementation, trioctylphosphine may be preferred since the formed trioctylphosphine sulfide possesses an appropriate reactivity toward cadmium alkylphosphonates to form a CdS shell of elongated shape. The CdSe seeds can be either added to the stock solution of S-precursor or prepared separately by dissolving the CdSe seeds in an appropriate solvent.

It will be appreciated that with respect to stages 301 and 302, the amounts of CdO, phosphonic acids, solvents, sulfur, and seeds can be varied while still achieving good results with respect to preparation of quantum rods in accordance with exemplary embodiments of the present invention (see, e.g., Examples 1-3 discussed below).

At stage 303, a Zn-precursor is prepared. Zn-precursors can be prepared in different ways.

In one exemplary embodiment, the Zn-precursor is a solution of zinc salt in an organic solvent. It can be prepared from ZnO and carboxylic acid by heating of both reactants in organic solvent at >300° C. for a few hours in an inert atmosphere. Examples of zinc salt and organic solvent are zinc oleate and 1-octadecene.

In another exemplary embodiment, the Zn-precursor is zinc salt which is isolated from solution prepared from ZnO and carboxylic acid by heating of both reactants in organic solvent at >300° C. for a few hours in an inert atmosphere. The isolation step can be performed by filtration of reaction mixture at r.t. or by evaporation of organic solvent in a vacuum. The isolated zinc salt can be dissolved in organic solvent for use in synthesis of quantum rods or can be used as is in solid form.

In yet another exemplary embodiment, the Zn-precursor is zinc salt obtained via an exchanged reaction between Zn salt of lower boiling carboxylic acid (e.g., zinc acetate) and higher boiling carboxylic acid (e.g., oleic acid or stearic acid).

The concentration of Zn salt in a solution can be varied. An exemplary concentration of Zn salt in the solution may be 0.1-5.0 mmol/g, or may be 0.2-1.0 mmol/g.

At stage 304, a fast injection is performed of the seeds and the S-precursor to the Cd-precursor at high temperature (>300° C.) for initiation of the growth of a CdS shell of elongated shape over the CdSe seeds. In the case where separate solutions of seeds and S-precursor are used, the seeds solution is injected first followed by injection of the S-precursor solution.

At stage 305, the Zn-precursor is added to the reaction mixture after the injection of the seeds and the S-precursor. Additional S-precursor may also be added to the reaction at stage 305. The addition of Zn-precursor into the reaction mixture containing CdSe/CdS quantum rods may be performed in a single step or multiple steps. The addition of S-precursor into the reaction mixture containing CdSe/CdS quantum rods may also be performed in a single step or multiple steps.

In one exemplary embodiment, the Zn-precursor is added to reaction mixture immediately after the injection of seeds and S-precursor. In another exemplary embodiment, the Zn-precursor is added some time after the injection (e.g., in the range of 1 s to 180 mins after the injection).

The rate and duration for the addition of the Zn-precursor can be varied. A rate for the addition of the Zn-precursor which minimizes temperature deviations may be preferred—e.g., the Zn-precursor may be added at a slow rate over a 1-20 min duration.

The amount of Zn-precursor that is added at stage 305 can vary. However, it should noted that in accordance with exemplary embodiments of the present invention, a small amount of Zn may result in a significant blue shift of absorption. For instance, as demonstrated with respect to Examples 1-3 discussed below, a Zn/Cd molar ratio of 1.57 resulted in blue shifts of 24 nm and 27 nm, respectively. In case of synthesis of blue emitting quantum rods, a Zn/Cd molar ratio was about 4.57 which results in blue shift of 102 nm.

Immediately after the injection of S-precursor and seeds at stage 304, emission wavelength begins shifting towards longer wavelengths at a fast rate. The shift towards longer wavelengths then slows down, and after a certain amount of Zn-precursor (around 1 equivalent to Cd) is added, the emission wavelength starts to slowly shift the other way towards shorter wavelengths. This shift towards shorter wavelengths (also referred to as a "blue shift") may be large (e.g., 10-150 nm), and happens slowly enough for a probe to be taken to measure a luminescence wavelength and quench the reaction at stage 306 when the emission wavelength reaches the desired emission wavelength. The foregoing principles are demonstrated with respect to Examples 1-3 and depicted in FIGS. 4-5.

The Zn-precursor can be added into the reaction mixture containing CdSe/CdS quantum rods in a single step or multiple steps. The single addition of Zn-precursor to the reaction mixture containing CdSe/CdS quantum rods provides blue shift of around 30-40 nm. Multiple addition of Zn-precursor results in further blue shift of the emission wavelength for more than 30 nm up to around 50 nm. Moreover, the addition of S-precursor enlarges the blue shift to around 100 nm (see Example 3 for multiple additions of Zn- and S-precursors). The addition(s) of Zn- or S-precursors can be performed in any combination.

Utilizing the Zn-precursor during the synthesis of the quantum rods also results in an increase of luminescence quantum yield due to improvement of CdS shell crystallinity by reducing the amount of charge/exciton surface traps (as demonstrated in Example 1 discussed below).

Figure 6:
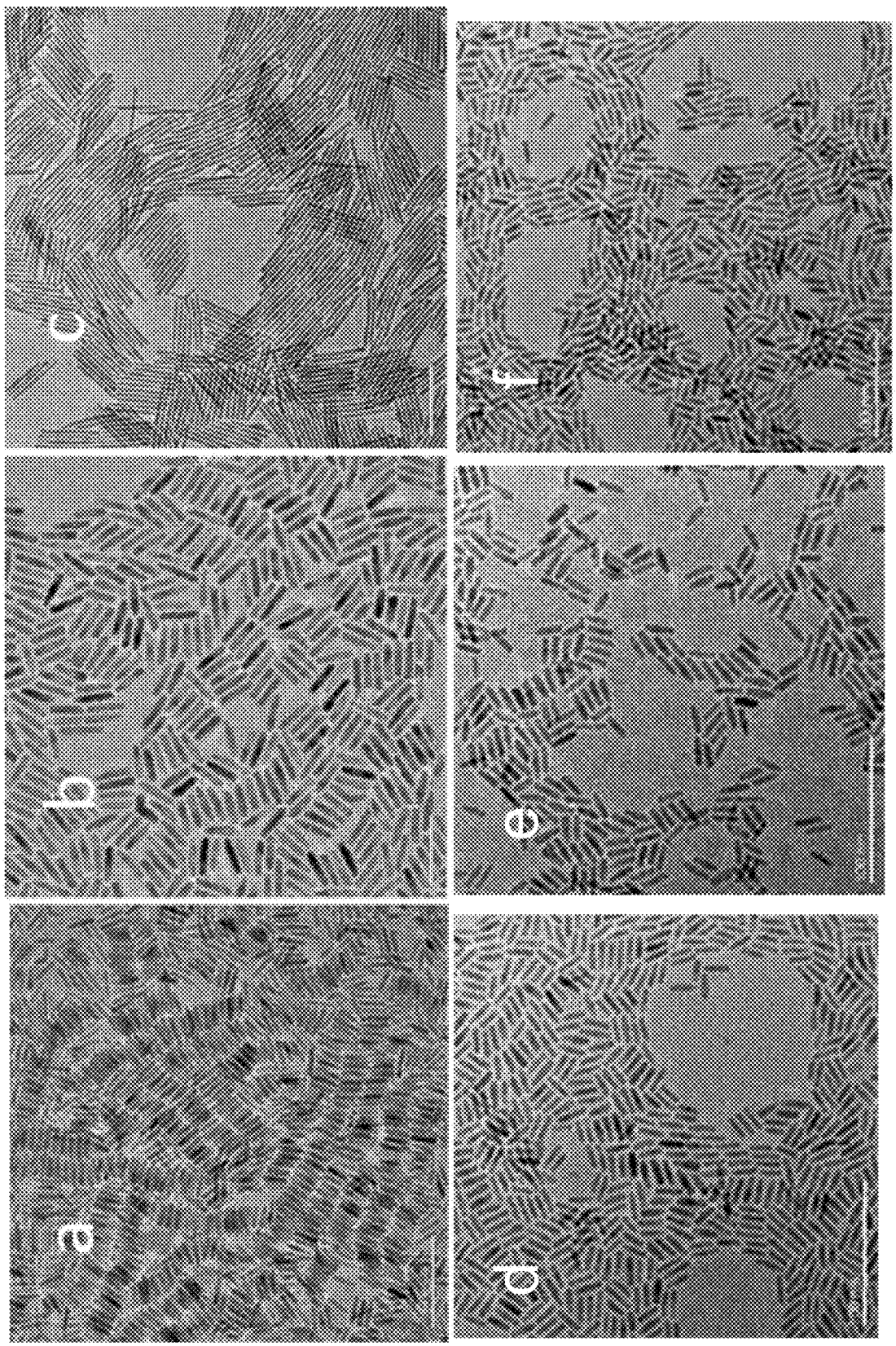
FIG. 6 depicts transmission electron microscopy (TEM) images of quantum rods obtained from the purification of Pr3 of Example 1 (part a of FIG. 6), from the final product of Example 1 (part b of FIG. 6), from the final product of Example 2 (part c of FIG. 6), from the Pr2 of Example 3 (part d of FIG. 6), from the Pr11 of Example 3 (part e of FIG. 6), and from the final product of Example 3 (part f of FIG. 6)
Figure 7:
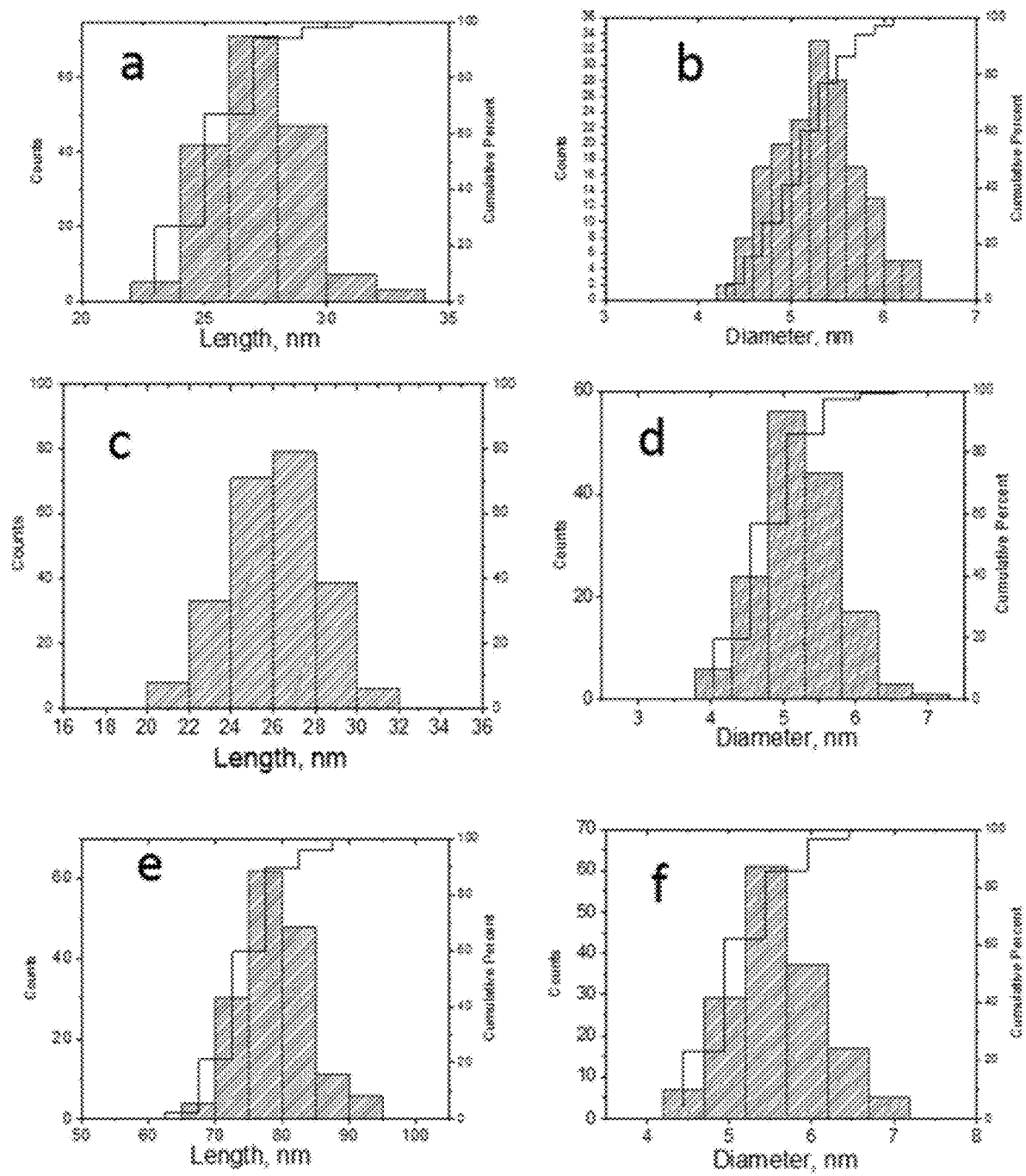
FIG. 7 depicts the size distribution of nanoparticles obtained from the purification of Pr3 of Example 1 (parts a-b of FIG. 7), from the final product of Example 1 (parts c-d of FIG. 7), and from the final product of Example 2 (parts e-f of FIG. 7).

The size and shape of the particles do not change significantly during Zn addition (compare part a of FIG. 6 to part c of FIG. 6 and compare part d of FIG. 6 to parts e-f of FIG. 6, and compare parts a-b of FIG. 7 to parts c-d of FIG. 7), but a blue shift of emission occurs.

At stage 306, after reaching the desired emission properties of the quantum rods, the reaction is quenched, for example, via cooling (e.g., by addition of a cold solvent to the reaction mixture and/or by removing the heating source).

The timing for terminating the reaction may vary based on the desired properties for the final product. In one exemplary embodiment, the reaction is immediately terminated after addition of Zn-precursor. In other exemplary embodiments, after addition of Zn-precursor, the reaction is allowed to proceed with a further blue shift of emission wavelength to the desired emission wavelength. In another exemplary embodiment the reaction is terminated after multiple additions of Zn-precursor or after multiple additions of Zn- and S-precursors. The time of reaction may vary—for example, it may take 30-120 mins after addition of Zn-precursor to reach a desired blue shift of emission wavelength of 10-30 nm depending on the reaction conditions and seed size. In other exemplary embodiments a blue shift of up to around 450 nm can occur within 16-20 hours depending on reaction rate which can be controlled by amounts of Zn- and S-precursors added.

At stage 307, purification of the final product (e.g., quantum rods) is performed via one or more precipitation-redispersion sequences. For precipitation, polar solvents (such as alcohols, ketones, etc.) may be used. The solvent used for precipitation should mix well with the reaction solvent and be able to dissolve organic impurities, starting materials, and other contaminations. For isolation of quantum rods from this mixture, centrifugation or filtration can be used. After isolation, the quantum rods are then dissolved in a weakly polar solvent (such as aromatic and aliphatic hydrocarbons, chlorinated alkanes, etc.), which results in a solution of quantum rods being obtained. The latter can be purified again (to remove contaminates that may still remain) by performing another precipitation procedure and another centrifugation (or filtration) procedure. Sonication may be used to speed up the process of dissolution of reaction product.

The separation of the final quantum rods from the reaction mixture can be performed by a normal procedure of precipitation/dissolving. For example, the reaction mixture can be diluted by toluene or another appropriate weak-polar solvent (benzene, chlorobenzene, etc.), and a polar solvent (like methanol, ethanol, acetone) can be added for precipitation of quantum rods. The quantum rods can be collected either by filtration or centrifugation and can be also further washed with appropriate solvent (e.g., toluene, benzene, chlorobenzene, etc.) following by precipitation and collection of the precipitate of quantum rods.

In another exemplary alternative embodiment, instead of adding Zn-precursor to a reaction mixture in stage 305, CdSe/CdS quantum rods can be separated from a reaction mixture after stage 304, dissolved in an appropriate high boiling solvent (e.g. TOPO, ODE, TOP) and further treated with Zn-precursor and S-precursor. The obtained CdSe/CdS quantum rods can be dissolved in a high boiling solvent, degassed via flushing with inert gas, heated to temperature above 270° C. (preferably above 300° C. or above 340° C.), and Zn-precursor can be added. To increase blue shift and/or reaction rate, S-precursor can be added either before or after addition of Zn-precursor. Multiple additions of Zn- and S-precursor can be performed.

In alternative exemplary embodiments, already-prepared CdSe/CdS quantum rods obtained by any other methods can be treated with Zn-precursor and/or S-precursor for controllable "blue" shift of emission wavelength. In this case, the process would start with the already-prepared CdSe/CdS quantum rods being mixed with Zn-precursor (and extra S-precursor) in a reaction mixture and/or by injection(s) of Zn-precursor (and extra S-precursor) to the reaction mixture comprising CdSe/CdS quantum rods.

The result of the process of FIG. 3 provides a final product of highly uniform quantum rods (see, e.g., FIGS. 6-7), stabilized with an organic ligand shell and almost free of impurities. The quantum rods can be dissolved in non-polar organic solvents.

The methods disclosed herein provide high reproducibility in terms of emission wavelength, shape, and size of the fabricated quantum rods. Quantum rods in accordance with the foregoing exemplary embodiments have better thermal/chemical stability in comparison to quantum rods without doping with Zn. The method makes possible the synthesis of quantum rods with emission in entire visible spectral range, including fully blue and green regions, which is not achievable by other colloidal methods for fabrication of seeded highly bright luminescent quantum rods (i.e., those in the absence of Zn-precursor).

Exemplary products achievable via the described methods include:
1. Quantum rods having a dot-in-rod structure with a $Cd_yZn_{1-y}Se$ seed and a $Cd_xZn_{1-x}S$ shell, wherein y is in the range from 0 to 1 and x is in the range from 0 to 0.99; and
2. Quantum rods having a rod-in-rod structure with a $Cd_yZn_{1-y}Se$ seed and a $Cd_xZn_{1-x}S$ shell, wherein y is in the range from 0 to 1 and x is in the range from 0 to 0.99.

At the initial stage of Zn-precursor addition, only the shell is affected by the addition of Zn, resulting in gradual decrease of Cd and an increase of Zn in the shell composition, which corresponds to a gradual change of index x from 1 (no Zn in the shell) to 0 (all Cd is replaced with Zn). As the reaction progresses, the CdSe seed may also be affected by the addition of Zn, resulting in either a decrease of initial CdSe seed size or a decrease of Cd and an increase of Zn in the seed composition which corresponds to a gradual change of index y from 1 (no Zn in the seed) to 0 (all Cd is replaced with Zn in the seed).

Figure 9:
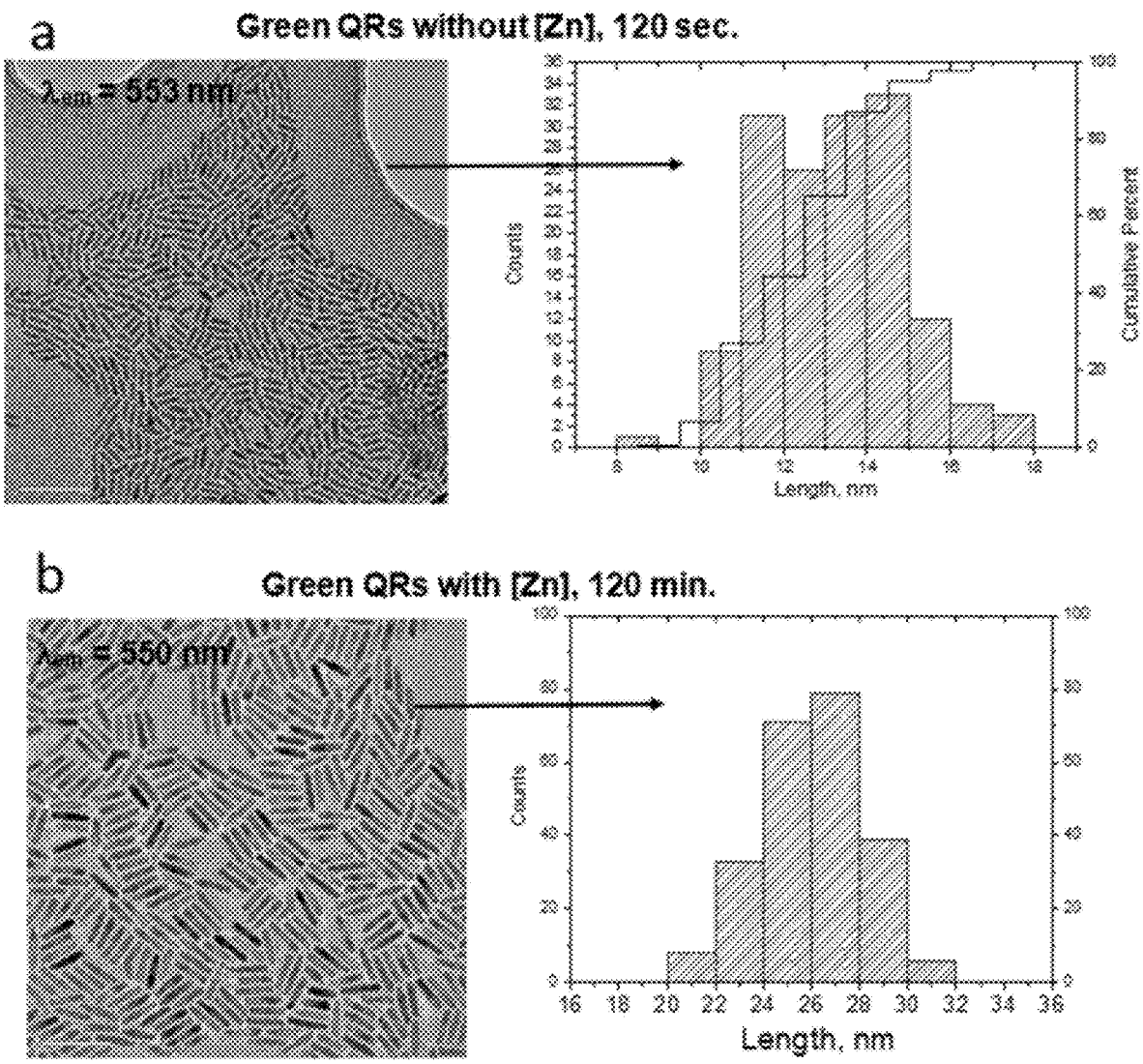
FIG. 9 depicts a comparison of "green" QRs obtained without Zn-precursor (part a of FIG. 9) and with Zn-precursor (part b of FIG. 9).
Figure 10:
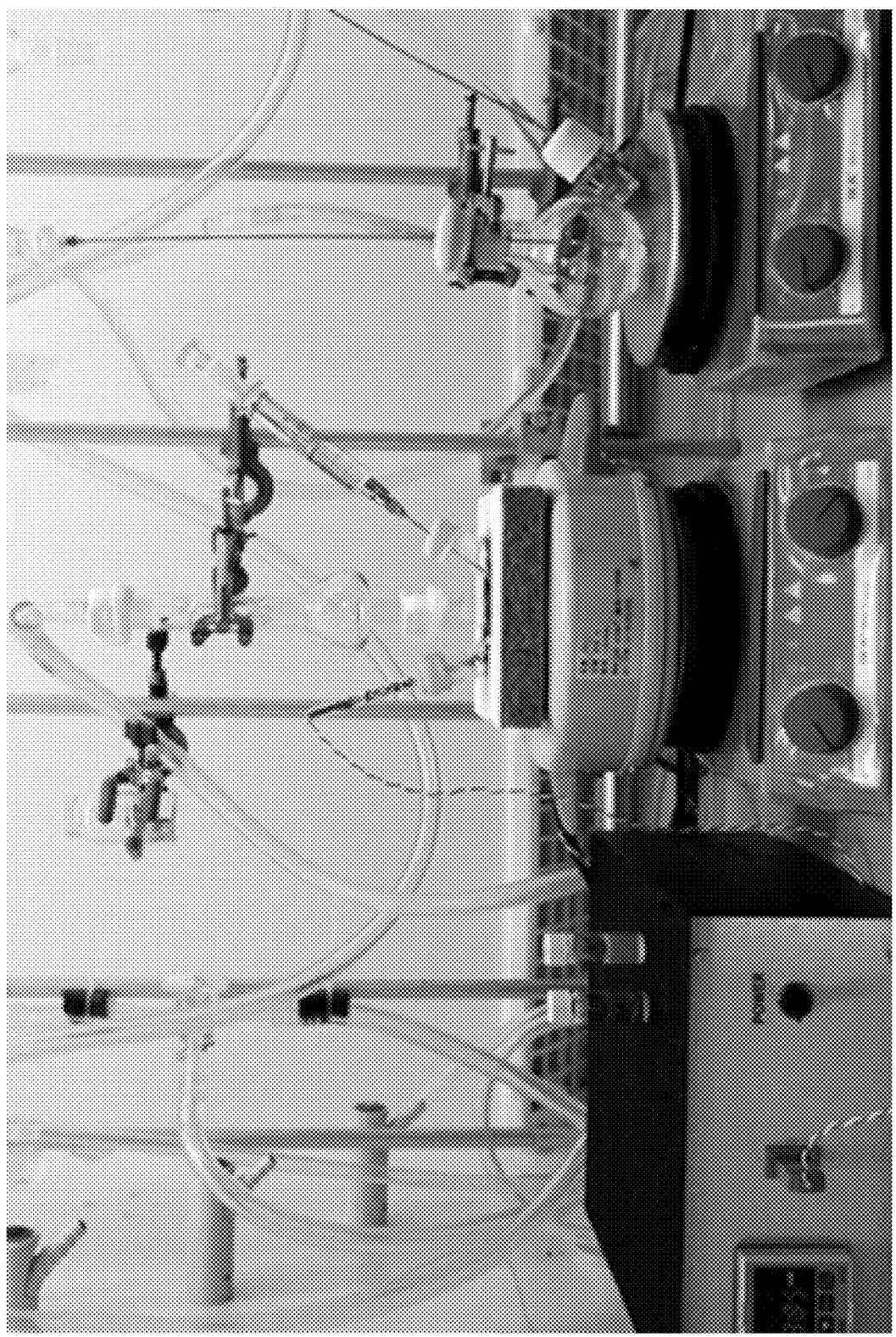
FIG. 10 depicts an exemplary laboratory installation for the synthesis of quantum rods. The laboratory installation includes an electronic thermocontroller (left), a heating source and a magnetic stirrer (bottom), a condenser trap with inert gas/vacuum supply (top), and a glass syringe with stainless steel needle (right).
Figure 11A:
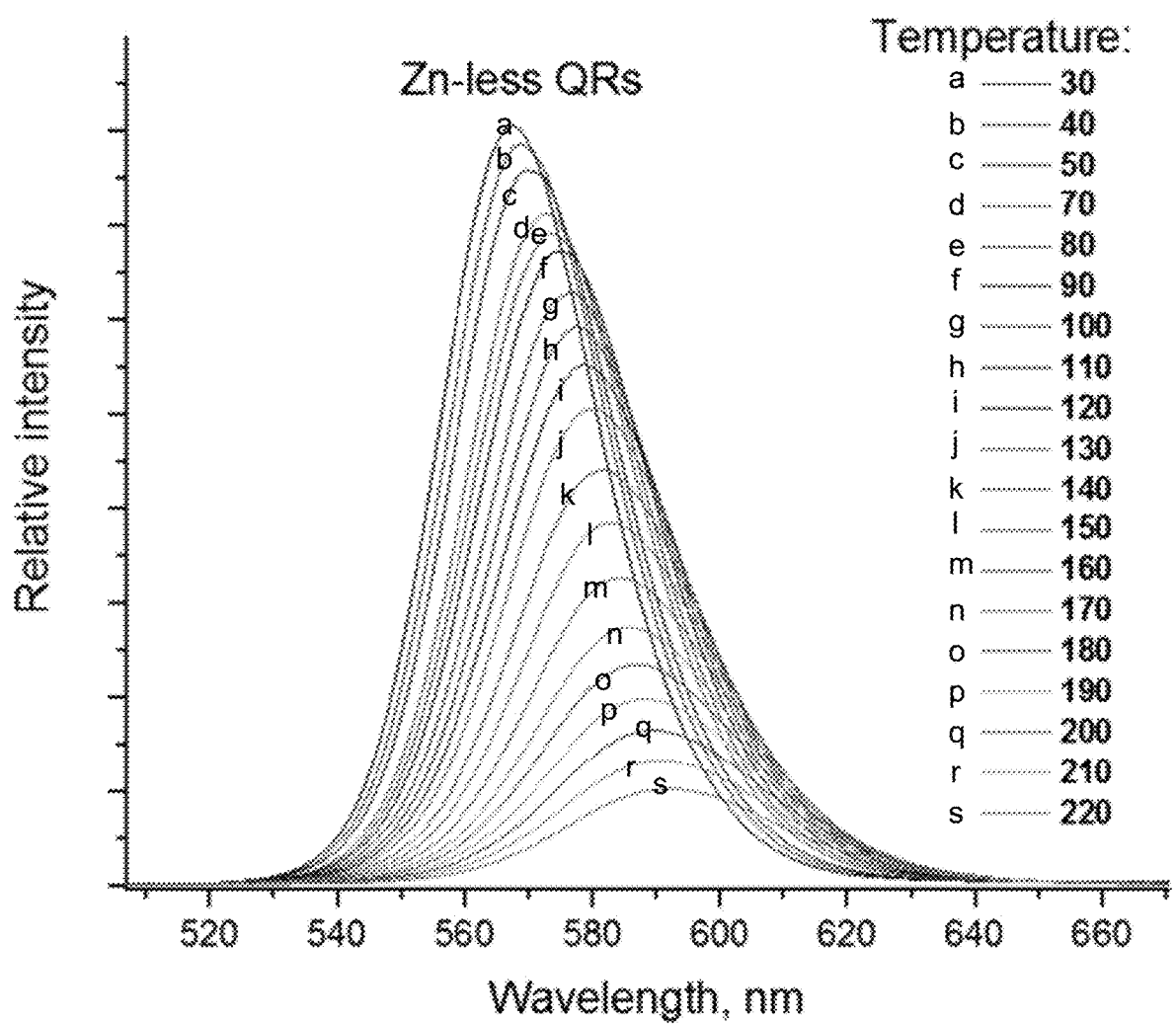
FIGS. 11A-11D depict the evolution of luminescence spectrum at different heat levels (FIGS. 11A-11B), temperature dependence of integrated emission intensity (FIG. 11C) and temperature dependence of FWHM (FIG. 11D) for quantum rods enriched with Zn (corresponding to Pr11 from Example 3) and enriched with Cd (corresponding to Pr3 from Example 3).
Figure 11B:
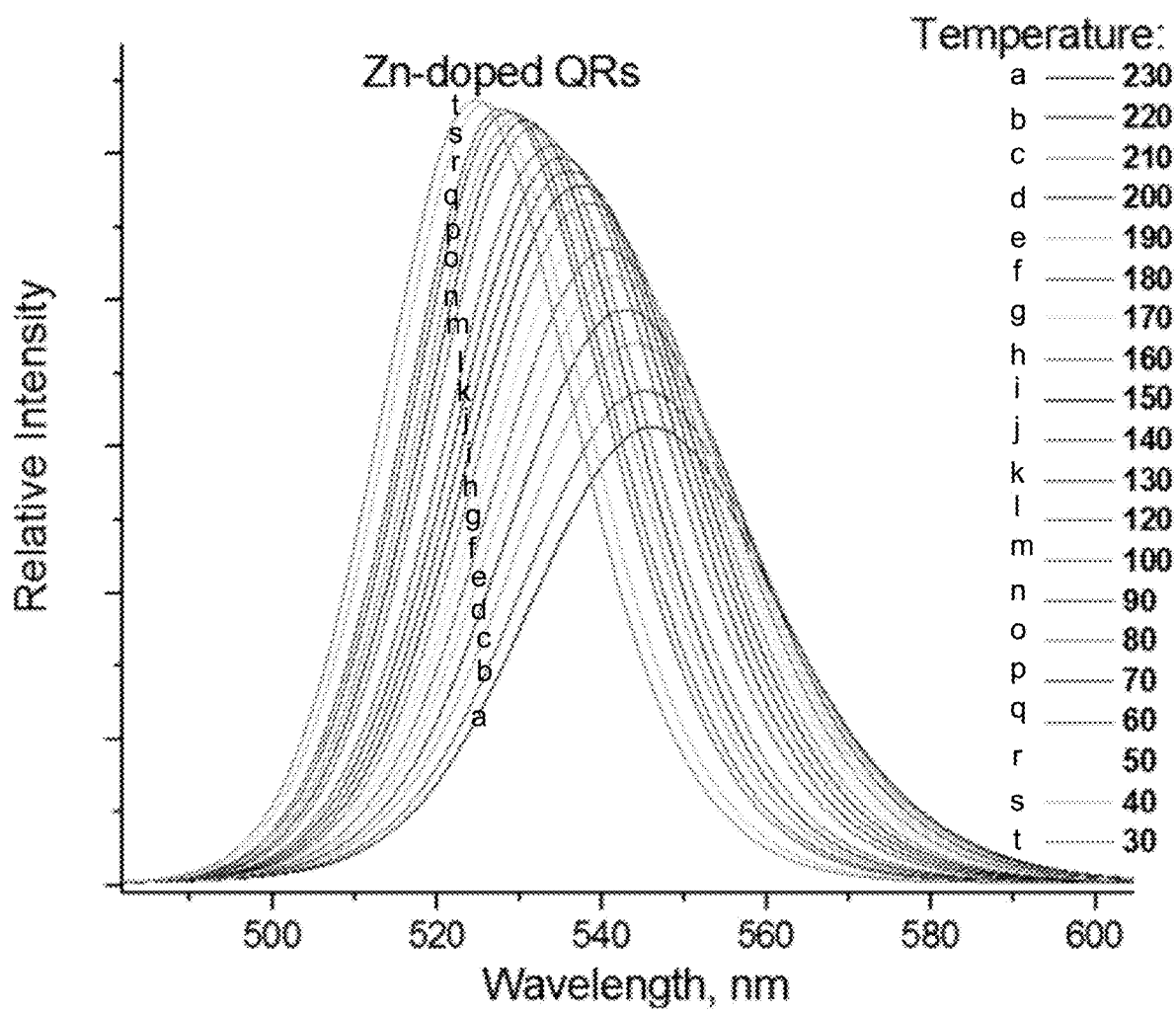
Figure 11C:
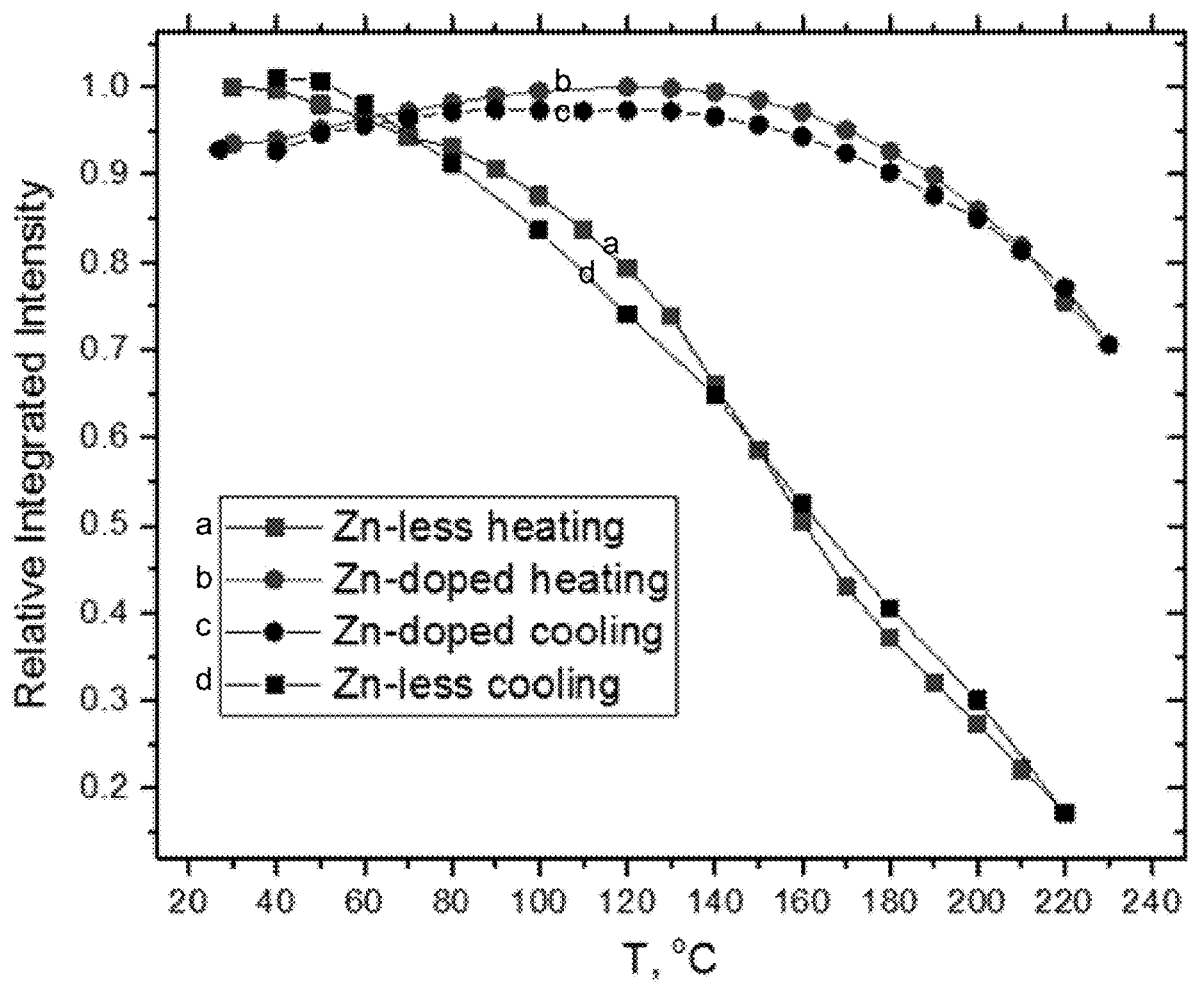
Figure 11D:
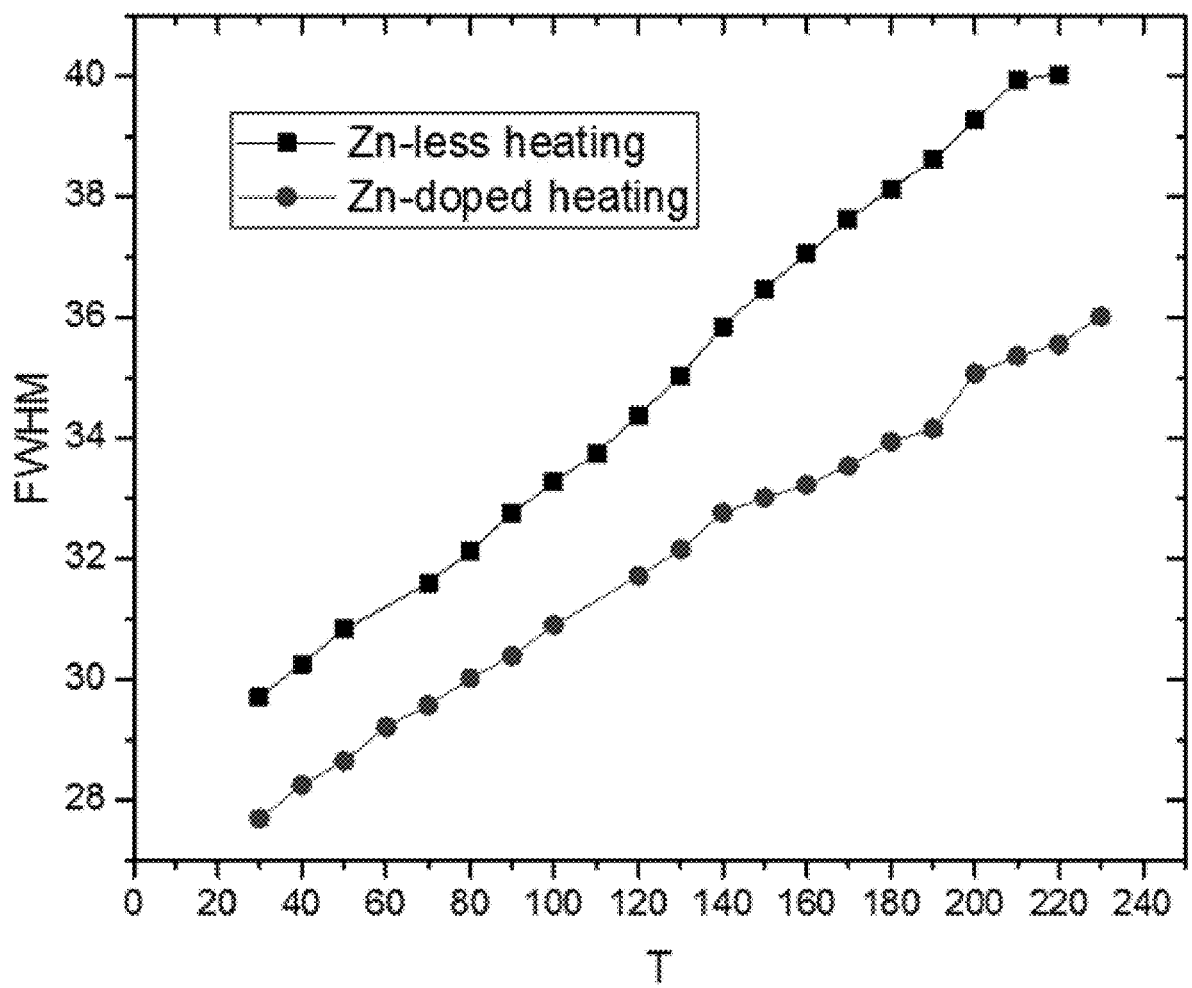

FIGS. 11A-11D shows enhanced thermal stability of the photoluminescence for Zn-doped quantum rods obtained by exemplary embodiments of the invention. It is clearly seen that the quantum rods treated with Zn-precursor, in comparison to quantum rods not treated with Zn-precursor, show stable PL properties up to 200° C., which is highly desired for LED applications (e.g., for on-chip architecture wherein the temperature can approach 150° C. or more). The obtained quantum rods are, in general, more homogeneous in terms of size and aspect ratio (see example in FIG. 9). Furthermore, the exchange of Cd with Zn is more favorable from an environmental perspective and a market perspective, in terms of lower toxicity of the obtained materials.

The following examples (Examples 1-3) further illustrate exemplary implementations of the present invention and demonstrate exemplary advantages achieved thereby. It will be appreciated that the following examples are exemplary and should not be construed as limiting the scope of the present invention.

Figure 8:
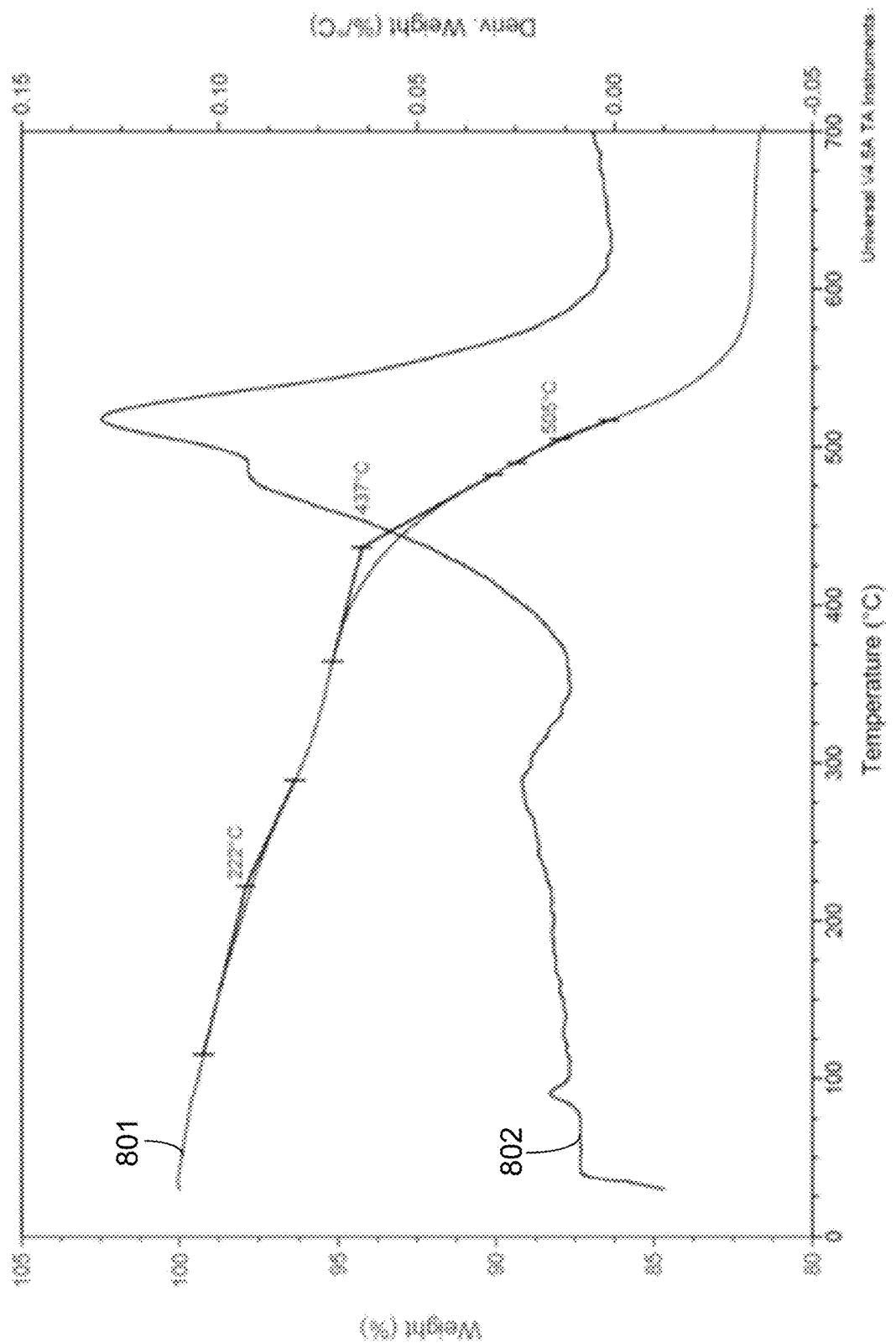
FIG. 8 depicts results of a thermogravimetrical analysis (TGA) performed with respect to a final purified product from Example 1. The 801 curve corresponds to mass lost, and the 802 curve corresponds to the mass loss derivative.

As demonstrated in connection with Example 1 and FIG. 8, exemplary embodiments of the present invention are able to achieve a mass loss of no more than 20%, which is a typical mass fraction of organic ligands for CdSe/CdS quantum rods.

It was further demonstrated in connection with Examples 1-2 that exemplary embodiments of the present invention are able to achieve a coefficient of variance (COV) (defined as COV=(standard deviation/average size)*100%) of less than 10%, which advantageously provides a narrow particle size distribution.

It was also further demonstrated in connection with Examples 1-3 that, according to exemplary embodiments of the present invention, the quantity of Zn-precursor (the ratio Zn/Cd) needed for significant gradual "blue" shift of emission wavelength during synthesis can be relatively small. Increasing the amount of added Zn-precursor would increase the "blue" shift of the emission wavelength due to the larger degree of replacement of Cd with Zn atoms in the composition of the quantum rods.

In addition to Examples 1-3, a control product was fabricated using the same reaction conditions for CdSe/CdS fabrication (including the ratios between reagents, temperature, the same seeds as in Example 1, concentrations, volumes, laboratory setup, etc.), but without the addition of Zn-precursor. In this synthesis, the reaction was terminated when the emission wavelength reached approximately the same value as for final product in example 1. As can be seen from the TEMs and plots in FIG. 9, the control QRs (part a of FIG. 9) had nearly the same emission wavelength as the QRs of Example 1 (part b of FIG. 9), had shorter size (13 nm on average vs. 26 nm on average), and large size distribution (12% COV vs. 8% COV). This demonstrates that the addition of the Zn-precursor allows for preparation of more uniform QRs with emission in green and blue spectral ranges.

Example 1

Example 1 provides an example for synthesis of a Zn-precursor and controlled synthesis of core-shell quantum rods using the Zn-precursor.

At a preliminary stage, the Zn-precursor was prepared as follows. A mixture of ZnO (Merger, 99%, 3.22 g, 123 mmol), oleic acid (Sigma, 85%, 71.1 g, 252 mmol) and 1-octadecene (Sigma, 90%, 100 ml) were degassed at reduced pressure (10-20 mbar) at 130° C. for 90 min with vigorous stirring, followed by five cycles of pumping out and filling with inert gas (nitrogen) sequence. The mixture was then heated up to 310° C. for 1 hour and allowed to cool to 95° C. At this temperature, the water formed during the reaction was removed from the reaction mixture under reduced pressure. During the evacuation, the mixture was slowly heated to 170° C. (1 hour) with vigorous stirring, followed by, again, five cycles of pumping out and filling with inert gas (nitrogen) sequence. The mixture was heated to 320° C. with vigorous stirring and the reaction was allowed to proceed until all the white solid was dissolved (8 hours). The solution (S1) was cooled to ambient temperature and used as is without further purification. The yield of the final mixture was 103.1 g, with the concentration of [Zn] being calculated to be 0.4 mmol/g, with density d 0.8 g/ml. The solution solidifies upon long storage at room temperature but melts upon slight heating 40° C.).

CdSe seeds were synthesized according to a known protocol, for example, as described in U.S. Pat. No. 6,872,249. After injection of an Se-precursor, the synthesis was terminated in 5 seconds. After precipitation, the seeds from the reaction mixture with methanol (1:1 volume ratio of Tol:MeOH) were washed once by dissolution in toluene and precipitation with methanol (1:1 ratio). The precipitate was collected by centrifugation, dissolved in toluene, filtered through a 0.2 μm polytetrafluoroethylene (PTFE) filter and the toluene was blown out by the steam of nitrogen. The yield of solid product was 134 mg. Emission spectra of the obtained nanoparticles are shown in part a of FIG. 4 ($\lambda_{max}$=504 nm). The obtained solid product was dissolved in 6.6 ml of TOP to form a clear solution with 20.25 mg/ml concentration (S2). The solution was stored under nitrogen in a dark place.

CdO (Meryer, 99%, 90 mg, 0.7 mmol), hexadecylphosphonic acid (99.95%, 265 mg, 0.86 mmol), hexylphosphonic acid (99.5%, 80 mg, 0.48 mmol) and trioctylphosphine oxide (Stream, 90%, 3.0 g, 7.8 mmol) were degassed in a similar manner as discussed above with respect to the synthesis of Zn precursor. Then, the suspension was heated to 340° C. with vigorous stirring, after which it became transparent colorless solution (S3). At this temperature trioctylphosphine (Stream, 97%, 1 ml) was swiftly injected. In a separate flask, sulfur (84 mg, 2.6 mmol) was dissolved in trioctylphosphine (1.6 ml) with vigorous stirring following by addition of solution S2 (400 mkl) to the obtained sulfur solution. The combined solution was swiftly injected to S3 at 375° C. to initiate the growth of elongated CdS shells around the CdSe seeds. This corresponds to the start of a reaction time counter.

Figure 4:
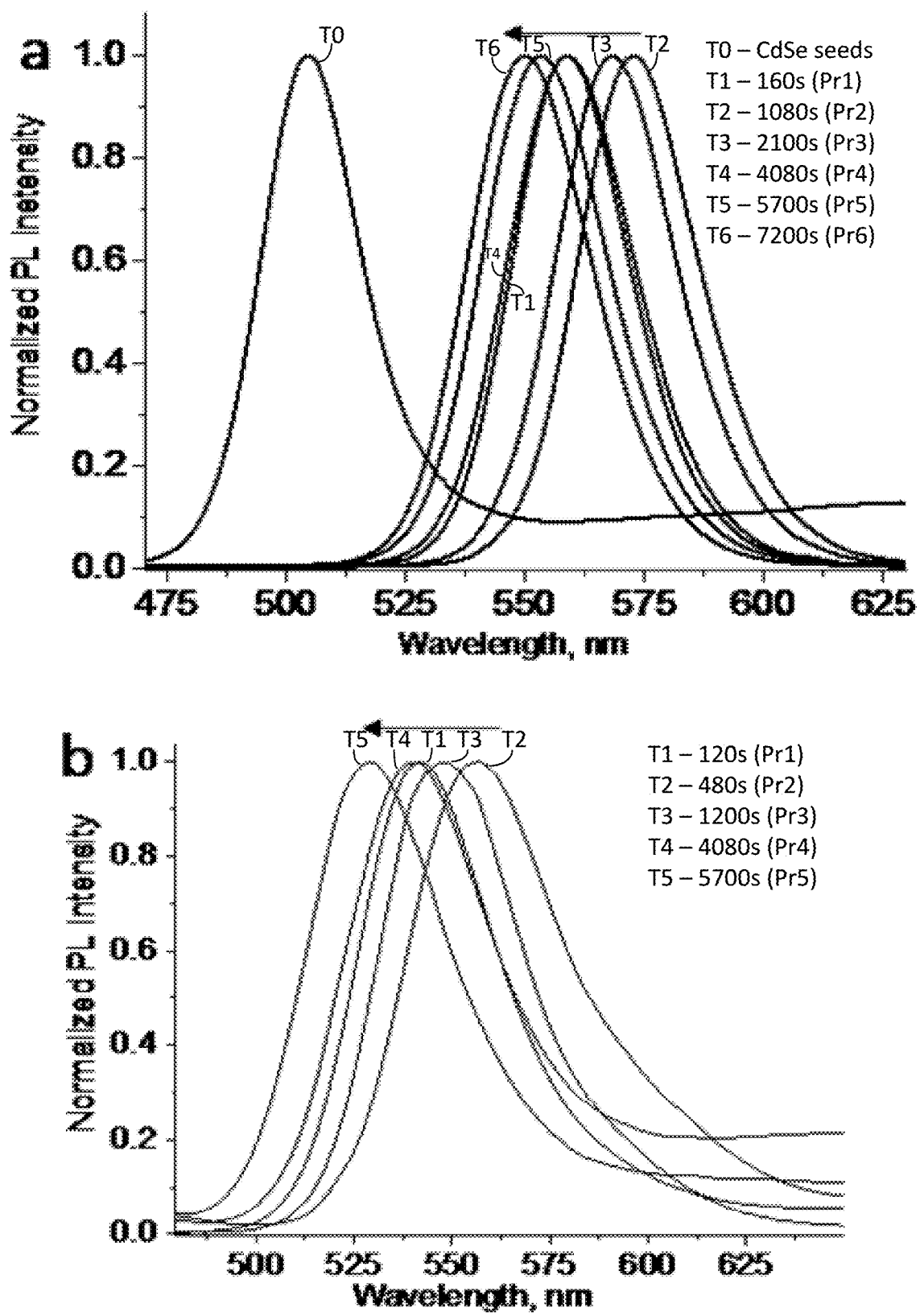
FIG. 4 depicts the evolution of emission spectra for quantum rods during synthesis in accordance with Example 1 (part a of FIG. 4) and Example 2 (part b of FIG. 4), corresponding to excitation by a 405 nm laser. The arrows indicate the "blue" shift of emission during the synthesis.

Probes were taken to measure emission wavelength of the nanoparticles at different times during the synthesis (see part a of FIG. 4 and Table 1 below). For example, as shown in part a of FIG. 4 and Table 1 below, a first probe is taken 2 minutes and 40 seconds after the start of the reaction time counter (Pr1: 160 sec.). Starting from 3 minutes after the start of the reaction time counter (when the temperature after injection has stabilized), solution S1 (3.5 g, 4.4 ml) was gradually added dropwise at the same temperature, 370° C., over a 30 minute duration. Second and third probes were taken at 18 minutes and 35 minutes (Pr2 and Pr3, respectively). A TEM image and a size distribution corresponding to the quantum rods corresponding to the third probe Pr3 are depicted in part a of FIG. 6 and parts a-b of FIG. 7. The dimensions of the quantum rods corresponding to the third probe Pr3 are as follows: 27.2 nm (SD=1.7 nm)×5.3 nm (SD=0.45 nm); COVs are 6% and 8% for length and width, respectively; aspect ratio=5.1. The reaction was further allowed to proceed for 90 min. Fourth, fifth and sixth probes Pr4, Pr5 and Pr6 were taken at 68 minutes, 95 minutes, and 120 minutes, respectively. The obtained emission spectra for the probes are depicted in part a of FIG. 4.

The synthesis was terminated by removing the heating source. Then, 10 ml of toluene were added at 180° C. After cooling to room temperature, the product was precipitated with 10 ml of ethanol, collected by centrifugation, and washed once by redispersion in toluene (8 ml, 10 min of ultrasonication) followed by precipitation with ethanol (8 ml, centrifugation). The obtained solid product was then redispersed in toluene (5 ml) and centrifuged (4000 rpm, 10 min). The solution was collected and filtered through a 0.2 μm PTFE filter, and the solvent was blown out by nitrogen stream at 60° C.

The yield was 120 mg. According to TGA data, the inorganic part of the product constitutes 82% of the product (see FIG. 8). The volatile part (18%) is consistent with the typical mass fraction of organic ligands on quantum rods surface. A TEM image and a size distribution corresponding to the resulting quantum rods are depicted in part b of FIG. 6 and parts c-d of FIG. 7, respectively. The dimensions of the resulting quantum rods were as follows: 26.1 nm (SD=2.1 nm)×5.2 nm (SD=0.54 nm); COVs are 8% and 10% for length and width, respectively; aspect ratio=5.0. The quantum yield (measured using integration sphere) was 59%. For comparison, quantum rods corresponding to the second and third probes Pr2 and Pr3 were treated in the same way (precipitation, washing, redispersion, and drying) and quantum yield measured (52% and 56%, respectively).

Figure 5:
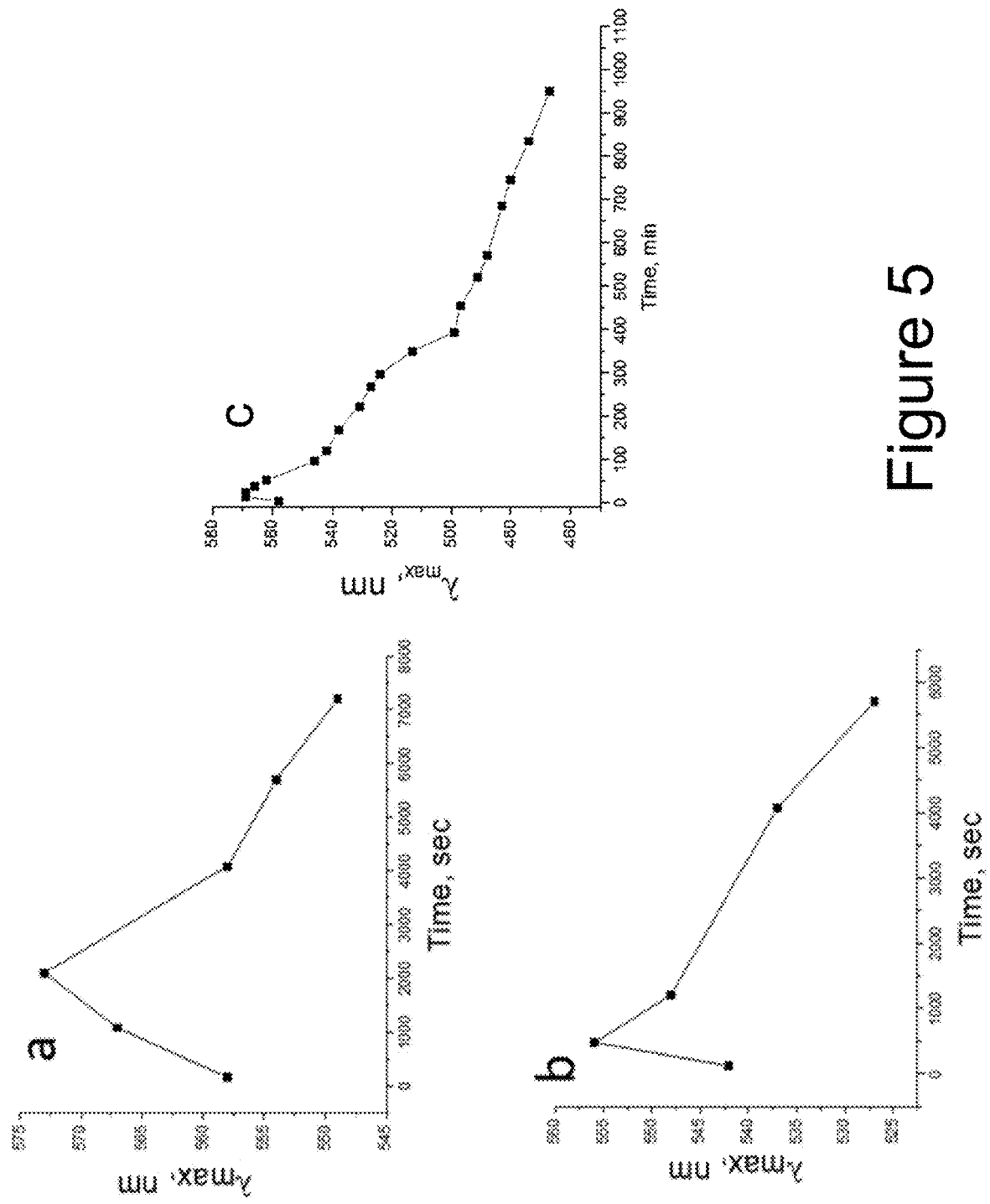
FIG. 5 depicts the kinetics of emission spectra evolution in accordance with Example 1 (part a of FIG. 5), Example 2 (part b of FIG. 5) and Example 3 (part c of FIG. 5).

The evolution of emission wavelengths during the synthesis of Example 1 is also shown in Table 1 below and in part a of FIG. 5.

TABLE 1

| Probe | Time, sec | $\lambda_{max}$, nm |
|---|---|---|
| Pr1 | 160 | 558 |
| Pr2 | 1080 | 567 |
| Pr3 | 2100 | 573 |
| Pr4 | 4080 | 558 |
| Pr5 | 5700 | 554 |
| Pr6 | 7200 | 549 |

Example 2

Example 2 provides an example for controlled synthesis of core-shell quantum rods using a Zn-precursor wherein 25 nm "blue" shift occurs.

CdSe quantum dot seeds were synthesized in a similar manner as discussed above with respect to Example 1, except that the reaction was terminated immediately after the injection of the Se-precursor. The CdSe seeds were purified in the same way and a solution with concentration 20.25 mg/ml was prepared (S4). The photoluminescence spectra of the obtained nanoparticles have an emission maximum, $\lambda_{max}$, at 473 nm.

The controlled synthesis of the quantum rods was performed in a similar manner as discussed above with respect to Example 1 using 200 μL of S4 instead of S3. With respect to Example 2, the mixture of S4 and S-precursor were used for initiation of CdS shell growth in a similar manner as discussed above with respect to Example 1. Then, starting from the fifth minute after starting the reaction, S1 was gradually added in over a duration of 25 minutes.

Probes were taken to measure emission wavelength of the nanoparticles formed at different points during the synthesis (Pr1: 2 mins., Pr2: 8 mins., Pr3: 20 mins., Pr4: 36 mins., Pr5: 75 mins.), the results of which are shown in Table 2 below and in part b of FIG. 4 and in part b of FIG. 5. The reaction was terminated at 76 minutes, and the product was isolated in a similar manner as discussed above with respect to Example 1.

The yield was 115 mg. A TEM photo and a size distribution of the resulting quantum rods are depicted in part c of FIG. 6 and in parts e-f of FIG. 7, respectively. The dimensions of the quantum rods were as follows: 79.4 nm (SD=4.7 nm)×5.3 nm (SD=0.55 nm); COVs were 6% and 10% for length and width, respectively; aspect ratio=15.0.

The evolution of emission wavelengths during the synthesis of Example 2 is also shown in Table 2 below and in part b of FIG. 5.

TABLE 2

| Probe | Time, sec | $\lambda_{max}$, nm |
|---|---|---|
| Pr1 | 120 | 542 |
| Pr2 | 480 | 556 |
| Pr3 | 1200 | 548 |
| Pr4 | 4080 | 537 |
| Pr5 | 5700 | 527 |

Example 3

Example 3 provides an example for controlled synthesis of core-shell quantum rods emitting in blue spectral range using multiple injections of Zn-precursor and additional injections of S-precursor with large (>100 nm) "blue" shift.

CdSe quantum dot seeds were synthesized in a similar manner as discussed above with respect to Example 1, except that the reaction was terminated 15 seconds after the injection of the Se-precursor. The CdSe seeds were purified in the same way and a solution with concentration 16.52 mg/ml was prepared (S5). The photoluminescence spectra of the obtained nanoparticles have an emission maximum, $\lambda_{max}$, at 519 nm.

The controlled synthesis of the quantum rods was performed in a similar manner as discussed above with respect to Example 1 using 350 μL of S5 instead of S3. With respect to Example 3, the mixture of S5 and S-precursor was used for initiation of CdS shell growth in a similar manner as discussed above with respect to Example 1. Then, starting from the fifth minute after starting the reaction, S1 was gradually added in over a duration of 20 minutes. The following additions of Zn-precursor were performed at 32 min (1 ml), 38 min (0.5 ml), 46 min (0.5 ml), 52 min (0.5 ml), 70 min (0.5 ml), 93 min (1 ml), 125 min (1 ml), 18 min (0.5 ml), 210 min (0.5 ml), 300 min (2 ml), 690 min (1 ml), 845 min (1 ml). The following additions of S-precursor (S1) were performed at 300 min (0.4 ml), 465 min (0.2 ml), 580 min (0.2 ml), 780 min (0.2 ml), 870 min (0.2 ml). Each addition means injection of solution with an average rate 0.2 ml/min. Probes were taken to measure emission wavelength of the nanoparticles formed at different points during the synthesis (Pr1: 3 min., Pr2: 13 min., Pr3: 24 min., Pr4: 38 min., Pr5: 51 min, Pr6: 95 min., Pr7: 120 min., Pr8: 167 min., Pr9: 222 min., Pr10: 268 min., Pr11: 298 min., Pr12: 350 min., Pr13: 394 min., Pr14: 454 min., Pr15: 520 min, Pr16: 570 min., Pr17: 685 min., Pr18: 745 min., Pr19: 835 min., Pr20: 950 min), the results of which are shown in Table 3 below and in part c of FIG. 5. The reaction was terminated at 950 minutes, and the product was isolated in a similar manner as discussed above with respect to Example 1. The yield was 100 mg. A TEM photo of the resulting quantum rods as well as the quantum rods isolated from Pr3 and Pr11 are depicted in part f, part d and part e of FIG. 6, respectively. The temperature dependence of photoluminescence intensity and FWHM for the quantum rods isolated from Pr11 (enriched with Zn) in comparison to ones isolated from Pr3 (enriched with Cd) are depicted in FIGS. 11A-11D.

TABLE 3

| Probe | Time, min | $\lambda_{max}$, nm |
|---|---|---|
| Pr1 | 3 | 558 |
| Pr2 | 13 | 569 |
| Pr3 | 24 | 569 |
| Pr4 | 38 | 566 |
| Pr5 | 51 | 562 |
| Pr6 | 95 | 546 |
| Pr7 | 120 | 542 |
| Pr8 | 167 | 538 |
| Pr9 | 222 | 531 |
| Pr10 | 268 | 527 |
| Pr11 | 298 | 524 |
| Pr12 | 350 | 513 |
| Pr13 | 394 | 499 |
| Pr14 | 454 | 497 |
| Pr15 | 520 | 491 |
| Pr16 | 570 | 488 |
| Pr17 | 685 | 483 |
| Pr18 | 745 | 480 |
| Pr19 | 835 | 474 |
| Pr20 | 950 | 467 |

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for fabricating quantum rods, comprising:
preparing a Cd-precursor;
preparing an S-precursor and CdSe seeds;
preparing a Zn-precursor;
mixing the S-precursor and the CdSe seeds with the Cd-precursor in a reaction mixture to initiate CdS shell growth over the CdSe seeds;
after initiating the CdS shell growth, adding the Zn-precursor to the reaction mixture;
stopping the reaction; and
performing a purification process to obtain the quantum rods.

2. The method according to claim 1, wherein the method further comprises adding additional S-precursor to the reaction mixture after initiating the CdS shell growth.

3. The method according to claim 2, wherein adding the additional S-precursor to the reaction mixture is performed in multiple steps.

4. The method according to claim 1, wherein adding the Zn-precursor causes a blue shift of emission wavelength.

5. The method according to claim 4, Wherein the blue shift is in the range of 10 nm to 150 nm.

6. The method according to claim 1, wherein the turn rods have an emission wavelength of less than or equal to 530 nm.

7. The method according to claim 1, wherein the quantum rods have an emission wavelength of less than or equal to 470 nm.

8. The method according to claim 1, wherein the quantum rods have thermally stable integral intensity of emission in a 0-200° C. temperature range.

9. The method according to claim 1 wherein the S-precursor and the CdSe seeds are prepared as a combined stock solution.

10. The method according to claim 1, wherein the S-precursor and the CdSe seeds are prepared as separate stock solutions.

11. The method according to claim 1, wherein mixing the S-precursor and the CdSe seeds with the Cd-precursor comprises injecting the S-precursor and the CdSe seeds into a reaction mixture comprising the Cd-precursor to initiate a reaction between the Cd-precursor with the CdSe seeds and the S-precursor.

12. The method according to claim 11, wherein the reaction mixture comprises a solvent at a temperature greater than 300° C.

13. The method according to claim 1 wherein the Zn-precursor is of general formula $Zn(RCOO)_2$.

14. The method according to claim 13, Wherein R is alkyl group $C_nH_{2n+1}$ with n being in the range of 0 to 30 or wherein R is a branched alkyl or alkenyl group or a branched carbon chain of total length in the range of 5 to 22 carbon atoms comprising two or more double or triple bonds.

15. The method according to claim 1, wherein the Zn-precursor is an individual chemical compound or a mixture of organic compounds.

16. The method according to claim 1, wherein the Zn-precursor comprises zinc salt or zinc oleate.

17. The method according to claim 1, wherein adding the Zn-precursor to the reaction mixture comprises adding the Zn-precursor to the reaction mixture in multiple steps.

18. The method according to claim 1 wherein the purification process comprises one or more precipitation-redispersion sequences.

19. A method for fabricating blue-shifted quantum rods, comprising:
preparing quantum rods comprising a CdSe seed and a CdS
blue-shifting the emission wavelength of the prepared quantum rods by reacting the prepared quantum rods with a Zn-precursor and an S-precursor;
stopping the reaction; and
performing a purification process to obtain the blue-shifted quantum rods.

20. The method according to claim 19, wherein the blue-shifted quantum rods have an emission wavelength of less than or equal to 530 nm.

* * * * *

UNITED STATES PATENT AND TRADEMARK OFFICE
CERTIFICATE OF CORRECTION

PATENT NO. : 11,056,613 B2  
APPLICATION NO. : 16/380598  
DATED : July 6, 2021  
INVENTOR(S) : Maksym F. Prodanov et al.

Page 1 of 1

It is certified that error appears in the above-identified patent and that said Letters Patent is hereby corrected as shown below:

In the Claims

At Column 16, Line 6, for Claim 5, the text "Wherein the blue" should read --wherein the blue--

At Column 16, Line 8, for Claim 6, the text "turn rods" should read --quantum rods--

At Column 16, Line 33, for Claim 14, the text "Wherein R is alkyl" should read --wherein R is alkyl--

Signed and Sealed this  
Twenty-fourth Day of August, 2021

Drew Hirshfeld  
*Performing the Functions and Duties of the*  
*Under Secretary of Commerce for Intellectual Property and*  
*Director of the United States Patent and Trademark Office*